(12) United States Patent
Nakagawa et al.

(10) Patent No.: US 11,470,274 B2
(45) Date of Patent: Oct. 11, 2022

(54) SOLID STATE IMAGING ELEMENT AND ELECTRONIC APPARATUS

(71) Applicant: Sony Semiconductor Solutions Corporation, Kanagawa (JP)

(72) Inventors: Daisuke Nakagawa, Kanagawa (JP); Shinichirou Etou, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 86 days.

(21) Appl. No.: 17/262,364

(22) PCT Filed: Aug. 28, 2019

(86) PCT No.: PCT/JP2019/033817
§ 371 (c)(1),
(2) Date: Jan. 22, 2021

(87) PCT Pub. No.: WO2020/050118
PCT Pub. Date: Mar. 12, 2020

(65) Prior Publication Data
US 2021/0306585 A1    Sep. 30, 2021

(30) Foreign Application Priority Data

Sep. 4, 2018 (JP) .............................. JP2018-165462
Nov. 8, 2018 (JP) .............................. JP2018-210853

(51) Int. Cl.
*H04N 5/3745* (2011.01)
*H03M 1/68* (2006.01)
(Continued)

(52) U.S. Cl.
CPC .............. *H04N 5/378* (2013.01); *H03M 1/46* (2013.01); *H03M 1/68* (2013.01); *H04N 5/37455* (2013.01); *G01S 17/894* (2020.01)

(58) Field of Classification Search
None
See application file for complete search history.

(56) References Cited

U.S. PATENT DOCUMENTS 4,851,838 A * 7/1989 Shier ................... H03M 1/1071
341/134
2005/0184894 A1   8/2005 Ando

FOREIGN PATENT DOCUMENTS

| JP | 2001-44837 A | 2/2001 |
|---|---|---|
| JP | 2005-210182 A | 8/2005 |
| JP | 2013-239951 A | 11/2013 |

OTHER PUBLICATIONS

International Search Report (PCT/ISA/210), International Application No. PCT/JP2019/033817, dated Nov. 13, 2019.
(Continued)

*Primary Examiner* — Mark T Monk
(74) *Attorney, Agent, or Firm* — Michael Best & Friedrich LLP

(57) ABSTRACT

A solid state imaging element according to an embodiment includes: a converter (14) that converts an analog pixel signal read out from a pixel into a bit value, successively for each of a plurality of bits, on the basis of a threshold voltage set according to a conversion history of the bit converted before a target bit; a plurality of voltage generation units (102a and 102b) that each generate a plurality of reference voltages; and a setting unit (12d) that sets the threshold voltage using the reference voltage selected from the reference voltages generated by each of the voltage generation units on the basis of a conversion result.

15 Claims, 17 Drawing Sheets

(51) Int. Cl.
*H03M 1/12* (2006.01)
*H04N 5/378* (2011.01)
*H03M 1/46* (2006.01)
*G01S 17/894* (2020.01)

(56) References Cited

OTHER PUBLICATIONS

Notification of Transmittal of the International Search Report and the Written Opinion of the International Searching Authority, or the Declaration (PCT/ISA/220), International Application No. PCT/JP2019/033817, dated Nov. 26, 2019.

* cited by examiner

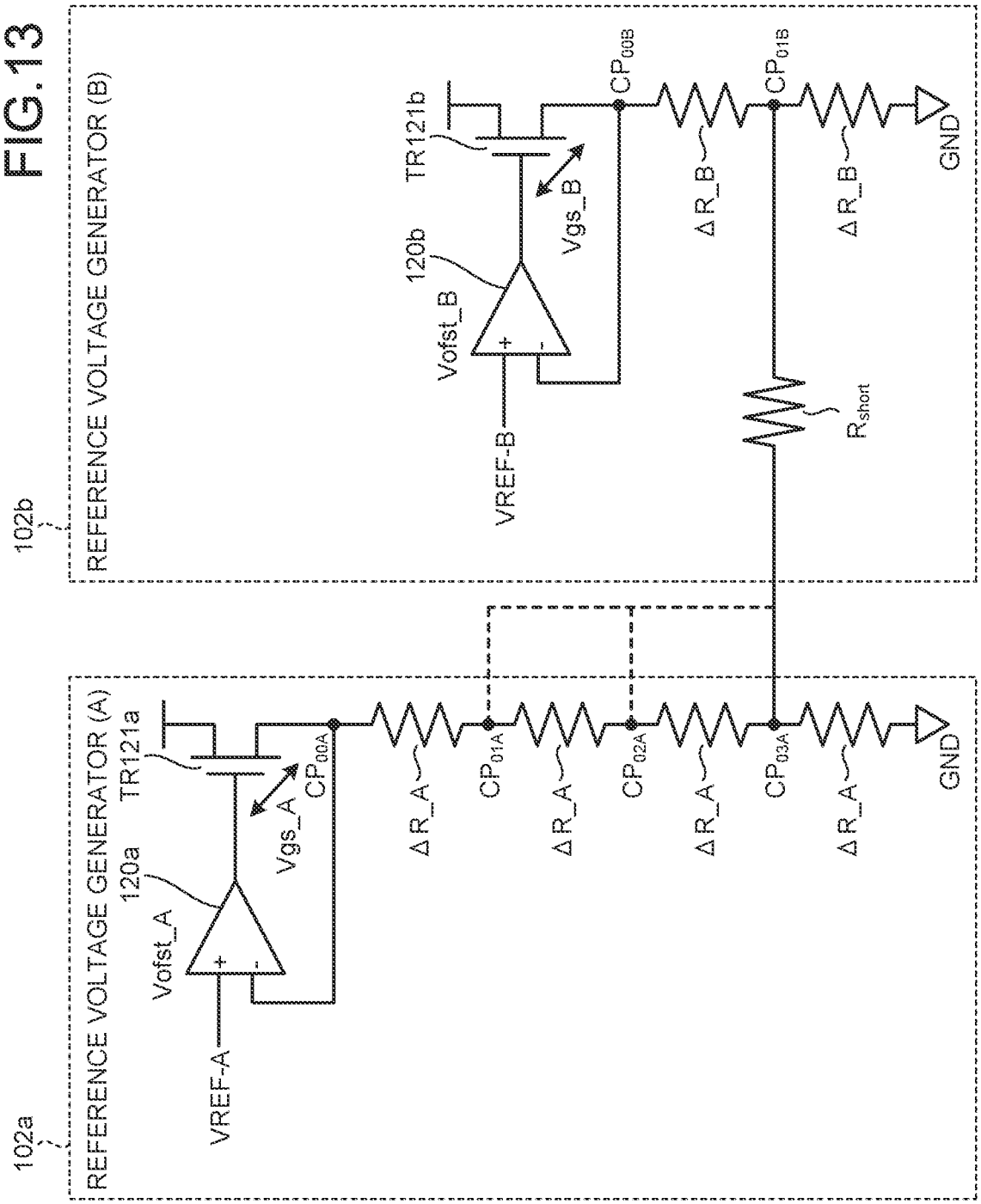

SOLID STATE IMAGING ELEMENT AND ELECTRONIC APPARATUS

FIELD

The present disclosure relates to a solid state imaging element and an electronic apparatus.

BACKGROUND

In an imaging element such as a complementary metal oxide semiconductor (CMOS) image sensor, light entering from a subject is photoelectrically converted by a photoelectric conversion element provided in each pixel and a voltage signal corresponding to an amount of obtained charges is read out via an amplifier transistor and a vertical signal line. The read out voltage signal is converted (AD converted) from an analog signal to a digital signal by an AD converter having a comparator to be output as imaging data.

As the AD converter used for the imaging element, a structure is known that employs a successive approximation type AD converter that successively converts an input signal into a digital value by comparing the input signal with a threshold voltage generated using a capacitive digital to analog (DA) converter on the basis of a reference voltage. In general, a conversion range of the AD converter applied to an image sensor has a redundant range with respect to a range of an input signal to be acquired to cope with characteristic variations of the AD converter and pixels.

CITATION LIST

Patent Literature

Patent Literature 1: Japanese Patent Application Laid-open No. 2013-239951

SUMMARY

Technical Problem

The characteristic variations include a component existing as a constant offset voltage regardless of the input signal range. When an analog gain is low, a voltage range of the input signal that can be converted by the AD converter is large. The offset voltage is seen to be relatively small with respect to the range of the input signal. The ratio of the redundant range to the input signal range can be reduced. When the analog gain is high, the offset voltage is seen to be larger with respect to the input signal range. The ratio of the redundant range to the input signal becomes large. In the AD converter, the number of bits in AD conversion is usually constant with respect to the analog gain. When the analog gain is high, the greater number of redundant bits is required. The number of bits of the AD converter is determined on the basis of the case where the analog gain is high. When the analog gain is low, an unnecessary redundant range is included. This requires a high reference voltage, thereby making it difficult to reduce power of a reference voltage source.

The disclosure proposes a solid state imaging element and an electronic apparatus that easily reduce the reference voltage in a successive approximation type AD converter.

Solution to Problem

For solving the problem described above, s solid state imaging element according to one aspect of the present disclosure has a converter that converts an analog pixel signal read out from a pixel into a bit value, successively for each of a plurality of bits, on the basis of a threshold voltage set according to a conversion history of the bit converted before a target bit; a plurality of voltage generation units that each generate a plurality of reference voltages; and a setting unit that sets the threshold voltage using the reference voltage selected from the reference voltages generated by each of the voltage generation units on the basis of the conversion history.

BRIEF DESCRIPTION OF DRAWINGS

FIG. 13 is a diagram illustrating a first example of a structure that can reduce a variance among a plurality of systems and is applicable to the first embodiment.

DESCRIPTION OF EMBODIMENTS

The following describes embodiments of the disclosure in detail with reference to the accompanying drawings. In the following embodiments, the same portions are labeled with the same numerals and duplicated descriptions thereof are omitted.

First Embodiment

Exemplary structure of solid state imaging element and electronic apparatus that are applicable to first embodiment.

Figure 1:
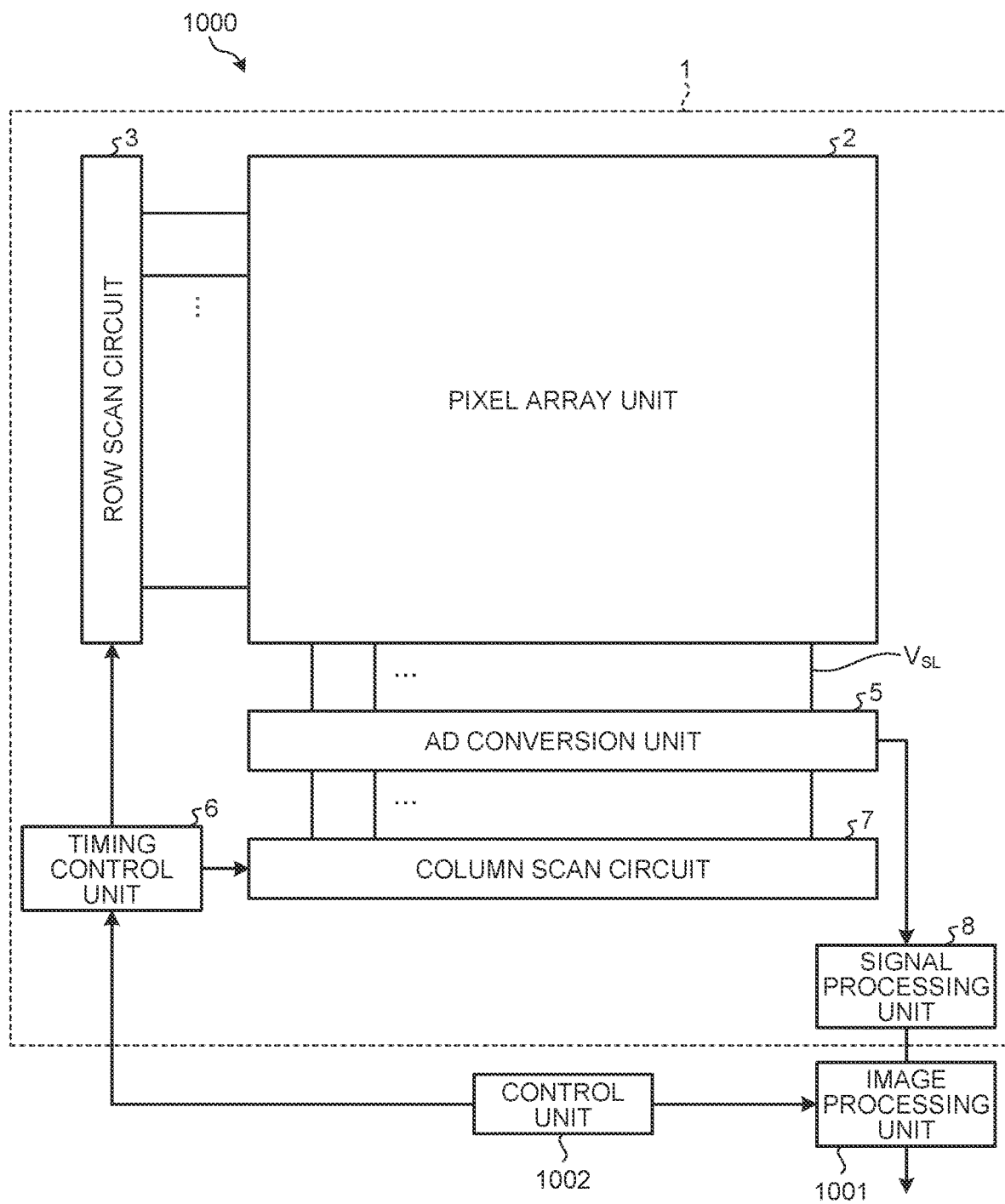
FIG. 1 is a block diagram illustrating an exemplary structure of a solid state imaging element and an electronic apparatus using the solid state imaging element that are applicable to a first embodiment.

FIG. 1 is a block diagram illustrating an exemplary structure of a solid state imaging element and an electronic apparatus using the solid state imaging element that are applicable to a first embodiment. In FIG. 1, an electronic apparatus 1000 applicable to the first embodiment includes a solid state imaging element 1, an image processing unit 1001, and a control unit 1002.

The solid state imaging element 1 includes a pixel array unit 2, a row scan circuit 3, an analog to digital (AD) conversion unit 5, a timing control unit 6, a column scan circuit 7, and a signal processing unit 8.

The pixel array unit 2 is provided with a plurality of scan lines and a plurality of signal lines. At each of the intersections of the scan lines and the signal lines, a pixel circuit is disposed. The multiple pixel circuits are provided in a two-dimensional grid shape. Under the control of the timing control unit 6, the row scan circuit 3 causes any one of the multiple scan lines to be active, and drives the pixel circuits of one row (corresponding to one column) included in the pixel array unit 2 corresponding to the scan line caused to be active to cause the pixel circuits to output pixel signals $V_{SL}$.

The timing control unit 6 controls timing at which each of the row scan circuit 3, the AD conversion unit 5, and the column scan circuit 7 operates on the basis of a clock signal supplied from the control unit 1002, for example.

The AD conversion unit 5 has a plurality of AD converters, which are described later, and converts the pixel signals $V_{SL}$, which are output from the pixel array unit 2 and analog signals, into pixel data, which are digital signals.

The column scan circuit 7, which operates in synchronization with the operation of the row scan circuit 3 and the AD conversion unit 5 under the control of the timing control unit 6, sequentially transfers, to the signal processing unit 8, the pixel data that is AD converted from the pixel signal $V_{SL}$ by the AD conversion unit 5 for each signal line. The signal processing unit 8 performs signal processing such as noise removal and auto gain control (AGC) on the transferred pixel data.

In the above description, the signal processing unit 8 is disposed in the solid state imaging element 1. The location is, however, not limited to this example. For example, the signal processing unit 8 can be provided separately outside the solid state imaging element 1. The circuits in the solid state imaging element 1 may be arranged on a single semiconductor substrate or arranged by being distributed on a plurality of layered semiconductor substrates.

For example, image data of one frame is formed by the pieces of pixel data of the pixel circuits included in the pixel array unit 2 after having been subjected to signal processing by the signal processing unit 8. The image data is output from the solid state imaging element 1 and transferred to the image processing unit 1001, for example. The image processing unit 1001 can perform image processing such as demosaic processing, white balance adjustment processing, and gamma correction processing on the image data transferred from the solid state imaging element 1, for example. The image processing unit 1001 can also perform compression encoding processing on the image data after having been subjected to such image processing.

The control unit 1002, which includes a central processing unit (CPU), a read only memory (ROM), a random access memory (RAM), a timer, and various interfaces, for example, controls the whole operation of the electronic apparatus 1000. For example, when the electronic apparatus 1000 is an imaging device that performs imaging in accordance with light entering the solid state imaging element 1 from a subject via an optical system, the control unit 1002 can perform control on the optical system and drive control on the solid state imaging element 1 (e.g., diaphragm control and exposure control).

Figure 2:
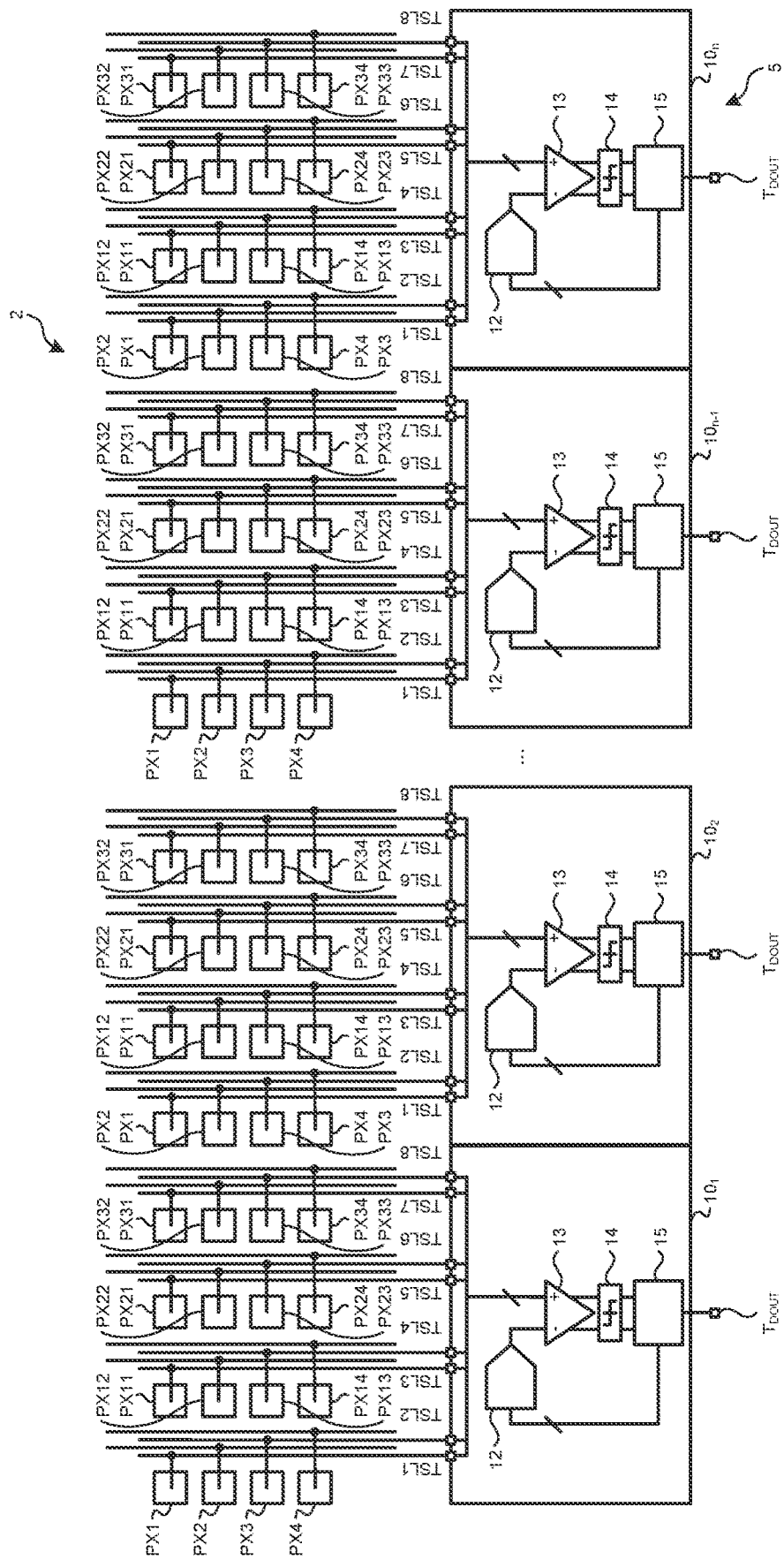
FIG. 2 is a block diagram illustrating an exemplary structure of an AD conversion unit applicable to the first embodiment.

FIG. 2 is a block diagram illustrating an exemplary structure of the AD conversion unit 5 applicable to the first embodiment. In FIG. 2, the AD conversion unit 5 includes a plurality of AD converters $10_1, 10_2, \ldots, 10_{n-1}$, and $10_n$ (n is a natural number). In FIG. 2, the structure including pixels PX1 to PX34, which are on the upper side of the AD converters $10_1, 10_2, \ldots, 10_{n-1}$, and $10_n$, corresponds to the pixel array unit 2 in FIG. 1.

In the example illustrated in FIG. 2, the AD conversion unit 5 performs processing in a time division manner on eight columns for each AD converter. For simplified illustration, FIG. 2 illustrates n number of AD converters $10_1$ to $10_n$ out of 2n number of provided AD converters (n is a natural number). Actually, n number of remaining AD converters are arranged on the upper side of output signal lines extending in the upper direction from the pixels.

In this case, the AD converters $10_1$ to $10_n$, each of which is an AD converter of a successive approximation type (hereinafter, called a successive approximation type AD converter), each include a digital to analog (DA) converter 12, a preamplifier unit 13, a comparator 14, and a logic unit 15.

In the example illustrated in FIG. 2, out of 16 pixels of pixels PX1 to PX4, pixels PX11 to PX14, pixels PX21 to PX24, and pixels PX31 to PX34, eight pixels, which are half of 16 pixels, are allocated for each of the successive approximation type AD converters $10_1$ to $10_n$.

Specifically, for each of the illustrated successive approximation type AD converters $10_1$ to $10_n$, eight pixels of the pixels PX1, PX3, PX11, PX13, PX21, PX23, PX31, and PX33 are allocated. In the same manner, for each of the n number of AD converters (not illustrated), eight pixels of the pixels PX2, PX4, PX12, PX14, PX22, PX24, PX32, and PX3 are allocated.

The following describes basic operation of the AD conversion unit 5 illustrated in FIG. 2. The successive approximation type AD converters $10_1$ to $10_n$, and the n number of AD converters (not illustrated) that are included in the AD conversion unit 5 perform processing in synchronization with and independently from one another. The basic operation is described using the successive approximation type AD converter $10_1$ as an example.

The successive approximation type AD converter $10_1$ performs processing, for each reading of data, in the order from the pixel PX1, the pixel PX3, the pixel PX11, the pixel PX13, the pixel PX21, the pixel PX23, the pixel PX31, to the pixel PX33, for example.

At a first processing timing, the DA converter 12 of the successive approximation type AD converter 101 generates, on the basis of a reference voltage, a threshold voltage $V_{th}$ corresponding to a bit position in accordance with a control signal having a digital value supplied from the logic unit 15. The threshold voltage $V_{th}$ generated by the DA converter 12 is input into one input end of the comparator 14 via the preamplifier unit 13.

Into the other input end of the comparator 14, the pixel signal $V_{SL}$ is input from a pixel signal input terminal selected out of the pixel signal input terminals $T_{SL1}$ to $T_{SL8}$ in a time division control manner. The comparator 14 compares the threshold voltage $V_{th}$ input into the one input end with the pixel signal $V_{SL}$ input into the other input end to send the comparison result to the logic unit 15.

The logic unit 15 holds a bit value of a target bit position in a register in accordance with the comparison result, for example. In accordance with the comparison result, the logic unit 15 generates a digital value for setting the threshold voltage $V_{th}$ corresponding to the next bit position to supply the digital value to the DA converter 12. The DA converter 12 performs DA conversion on the digital value to generate the threshold voltage $V_{th}$. The generated threshold voltage $V_{th}$ is input into the other input end of the comparator 14 via the preamplifier unit 13.

The successive approximation type AD converter $10_1$ successively repeats the processing described above from a most significant bit to a least significant bit for each bit to convert the pixel signal $V_{SL}$ into the digital pixel data. For example, when the logic unit 15 ends the processing up to the least significant bit, the successive approximation type AD converter $10_1$ outputs pixel data $DV_{SL}$ having a certain bit length held in a register of the logic unit 15, for example, from an output terminal $T_{DOUT}$.

In the same manner, at each of the processing timings from a second processing timing to an eighth processing timing under the time division control, the successive approximation type AD converter $10_1$ performs processing on the input pixel signals $V_{SL}$ that are input from the input pixel signal input terminals $T_{VSL2}$ to $T_{VSL8}$ and correspond to the respective pixels PX3, PX11, PX13, PX21, PX23, PX31, and PX33.

The successive approximation type AD converters $10_2$ to $10_n$ and the n number of AD converters (not illustrated) perform the same processing simultaneously in parallel.

More specific example of AD conversion processing according to the first embodiment Structure according to existing technique and example of processing thereby The following describes a structure of the successive approximation type AD converters $10_1$ to $10_n$, according to the first embodiment and AD conversion processing thereby. In the following description, the successive approximation type AD converters $10_1$ to $10_n$, are collectively described as the successive approximation type AD converters 10 unless otherwise specifically described. Prior to the description about the first embodiment, a structure of the successive approximation type AD converter according to an existing technique and an example of processing thereby, which corresponds to the successive approximation type AD converters $10_1$ to $10_n$, according to the first embodiment, are described for the purpose of making it easy to understand the description.

The successive approximation type AD converter successively compares, by binary search, a voltage of the input signal with the threshold voltage $V_{th}$ that is generated for each bit on the basis of voltage values that are generated from the reference voltage, increase in a binary manner, and correspond to the number of bits, thereby converting the input signal, which is an analog signal, into a digital signal. The threshold voltage $V_{th}$ is generally generated by a capacitive DA converter using capacitors having capacitances increasing in a binary manner. When a single reference voltage is used, the capacitance of the capacitors required by the capacitive DA converter becomes large, resulting in the circuit area being increased.

Figure 3:
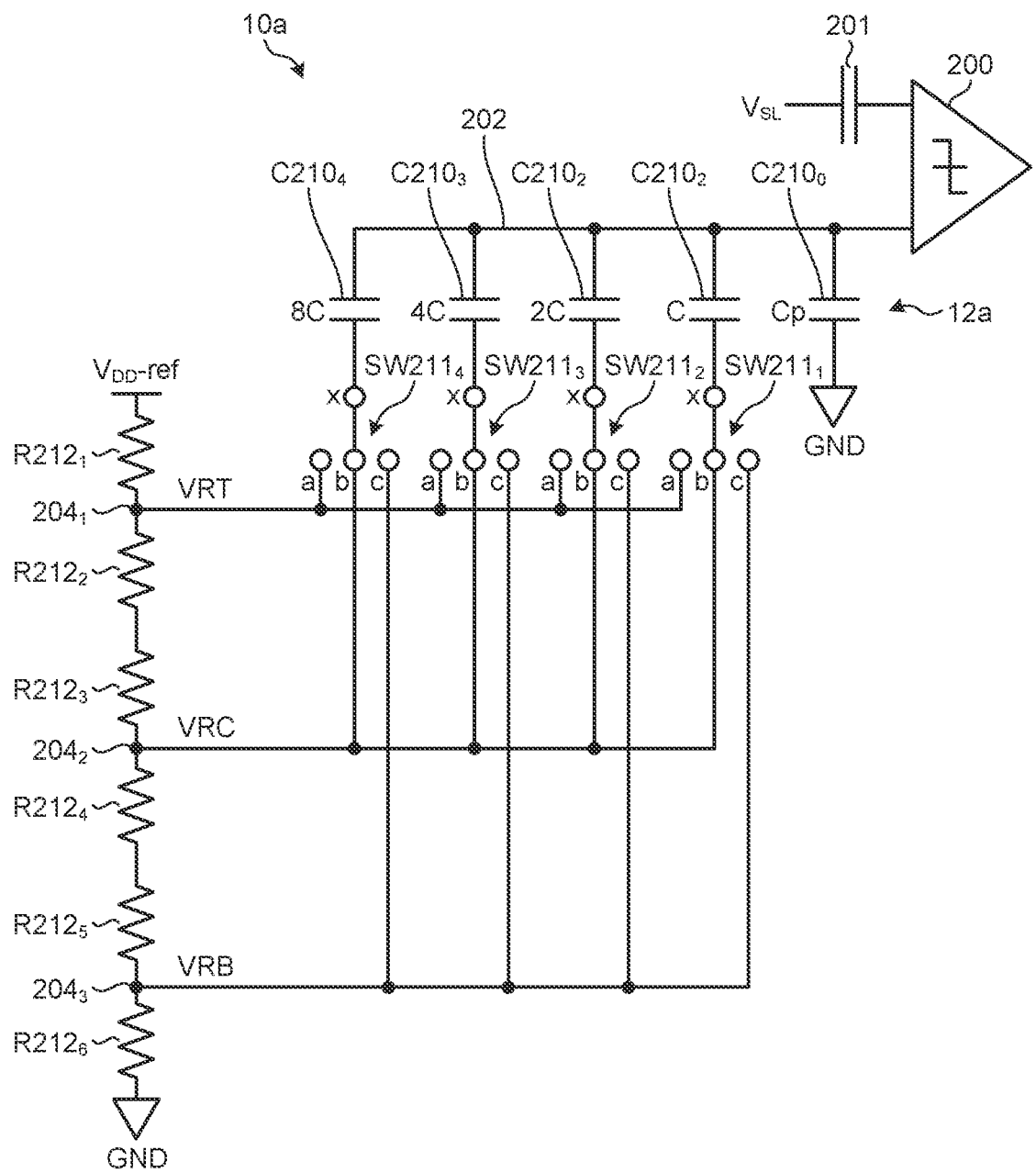
FIG. 3 is a diagram illustrating an exemplary structure of a successive approximation type AD converter according to an existing technique, the successive approximation type AD converter including a DA converter that generates a plurality of reference voltages from a single voltage.

A successive approximation type AD converter has been proposed that uses a capacitive DA converter having a plurality of reference voltages. FIG. 3 is a diagram illustrating an exemplary structure of a successive approximation type AD converter 10a according to an existing technique. The successive approximation type AD converter 10a includes a DA converter 12a that generates a plurality of reference voltages of an upper limit voltage VRT, an intermediate voltage VRC, and a lower limit voltage VRB from a single voltage. In the example illustrated in FIG. 3, the upper limit voltage VRT, the intermediate voltage VRC, and the lower limit voltage VRB are generated by resistance voltage division from a single voltage $V_{DD}$-ref. A voltage VREF that is a difference between the upper limit voltage VRT and the lower limit voltage VRB is an AD conversion range of the successive approximation type AD converter 10a.

In the successive approximation type AD converter 10a illustrated in FIG. 3, the preamplifier unit 13 and the logic unit 15 that are illustrated in FIG. 2 are omitted.

In the successive approximation type AD converter 10a illustrated in FIG. 3, a voltage $V_{ref}$ of the voltage $V_{DD}$-ref is divided into voltages by resistors $R212_1$ to $R212_6$ that form a ladder resistance circuit. The upper limit voltage VRT, the intermediate voltage VRC, and the lower limit voltage VRB are taken out from the connection points $204_1$ to $204_3$, respectively.

In the successive approximation type AD converter 10a, the pixel signal $V_{SL}$ is input into the other input end of a comparator 200 (corresponding to the comparator 14 in FIG. 2) via a coupling capacitor 201.

To one input end of the comparator 200, one ends of capacitors $C210_1$, $C210_2$, $C210_3$, and $C210_4$, which are used for generating the threshold voltage $V_{th}$ and have capacitances C, 2C, 4C, and 8C, respectively, the capacitances increasing in a binary manner (by two times), via a connection line 202. The other ends of the capacitors $C210_1$ to $C210_4$ are connected to terminals x of switches $SW211_1$ to $SW211_4$, respectively. The switches $SW211_1$ to $SW211_4$ are each controlled such that one of terminals a, b, and c is connected to the terminal x by a control signal output from the logic unit 15 (not illustrated).

In each of the switches $SW211_1$ to $SW211_4$, the terminal a is connected to the connection point $204_1$ to receive supply of the upper limit voltage VRT, the terminal b is connected to the connection point $204_2$ to receive supply of the intermediate voltage VRC, and the terminal c is connected to the connection point $204_3$ to receive supply of the lower limit voltage VRB. A voltage VREF that is a potential difference between the upper limit voltage VRT and the lower limit voltage VRB is an AD conversion range of the successive approximation type AD converter 10a.

A capacitance Cp represents a stray capacitance of the connection line 202.

In the structure, a voltage taken out from the connection point between the capacitor selected by the switches $SW211_1$ to $SW211_4$ out of the capacitors $C210_1$ to $C210_4$ and a capacitor $C210_0$ is input into one input end of the comparator 200 as the threshold voltage $V_{th}$.

As for the operation, the terminals x and the terminals b are connected in the switches $SW211_1$ to $SW211_4$, respectively, resulting in the intermediate voltage VRC being applied to the ends of the capacitors $C210_1$ to $C210_4$ on the side of the terminals x of the switches $SW211_1$ to $SW211_4$, and then a specific potential is applied to the connection line 202 connected to the one input end of the comparator 200, thereby resetting the capacitors $C210_1$ to $C210_4$.

The comparator 200 compares the pixel signal $V_{SL}$ input into the one input end with the threshold voltage $V_{th}$ input into the other input end. As a result of the comparison, when the voltage value of the pixel signal $V_{SL}$ is higher than the voltage value of the threshold voltage $V_{th}$, the comparator 200 determines the bit value to be "1" while when the voltage value of the pixel signal $V_{SL}$ is lower than the voltage value of the threshold voltage $V_{th}$, the comparator 200 determines the bit value to be "0", for example. When the determination of the most significant bit (MSB) is "1" as the determination result at the reset of the respective capacitors $C210_1$ to $C210_4$, for example, the terminal a and the terminal x are connected in the switch $SW211_4$. As a result, the threshold voltage $V_{th}$ is increased by the capacitor $C210_4$ having the capacitance 8C. When the determination result at the reset is "0", the terminal c and the terminal x are connected in the switch $SW211_4$ to reduce the threshold voltage $V_{th}$.

For the determination of the next bit, the threshold voltage $V_{th}$ is used that is changed in accordance with the determination result of the previous bit. When the previous determination result is "1", the terminal x and the terminal a are connected in the switch $SW211_3$. As a result, the threshold voltage $V_{th}$ is reduced by the capacitor $C210_3$ that has the capacitance 4C and is connected to the one input end of the comparator 200 via the connection line 202. When the previous determination result is "0", the terminal x and the terminal c are connected in the switch $SW211_3$. As a result, the threshold voltage $V_{th}$ is reduced by the capacitor $C210_3$ connected to the one input end of the comparator 200 via the connection line 202. In the same manner as described above, the comparator 200 compares the pixel signal $V_{SL}$ with the threshold voltage $V_{th}$. When the voltage value of the pixel signal $V_{SL}$ is higher than the voltage value of the threshold voltage $V_{th}$, the comparator 200 determines the bit value to be "1" while when the voltage value of the pixel signal $V_{SL}$ is lower than the voltage value of the threshold voltage $V_{th}$, the comparator 200 determines the bit value to be "0".

The successive approximation type AD converter 10a repeatedly performs the processing described above up to the final bit to convert the pixel signal $V_{SL}$ into the pixel data having a digital value. As described above, the successive approximation type AD converter 10a successively performs conversion of the input voltage, for each bit, from the high order side bit to the low order side bit using the threshold voltage $V_{th}$ set based on the conversion result of the high order bit.

When the AD conversion is performed on the pixel signal, a voltage width of the voltage VREF needs to be set larger in consideration of distribution variation in precharge phase (P phase), an offset voltage of the comparator 200, and further gain loss in the DA conversion due to the stray capacitance and a redundant bit capacitance in the capacitive DA converter. The size of 1LSB is determined by an input range of the pixel signal $V_{SL}$ input into the comparator 200 and the number of bits in the AD conversion. For increasing the voltage width of the voltage VREF without changing 1LSB, it is necessary to increase the number of bits of the DA converter 12a.

When a DA conversion range is increased by one bit in the DA converter 12a, the voltage value of the voltage VREF needs to be doubled. The upper limit of the voltage VREF is determined by a power source voltage. As the voltage increases, power consumption of a reference voltage generation circuit increases. In order to reduce the voltage value of the voltage VREF, a method exists in which capacitances of the capacitors used for generating the threshold voltage $V_{th}$ in the DA converter 12a are increased, thereby reducing the gain loss in the DA conversion. This method, however, causes an increase in circuit area and occurrence of settling deterioration in the DA converter 12a.

Particularly, the connection point $204_2$, from which the intermediate voltage VRC is taken out and which is an intermediate node in the ladder resistance circuit composed of the resistors $R212_1$ to $R212_6$, has a high output impedance. This causes long time settling in the DA conversion. When the resistance value of the ladder resistance circuit is reduced so as to achieve short time settling in the DA conversion, a current needs to be increased for securing a necessary DA conversion range, resulting in an increase in power consumption of the reference voltage generation circuit.

Figure 4:
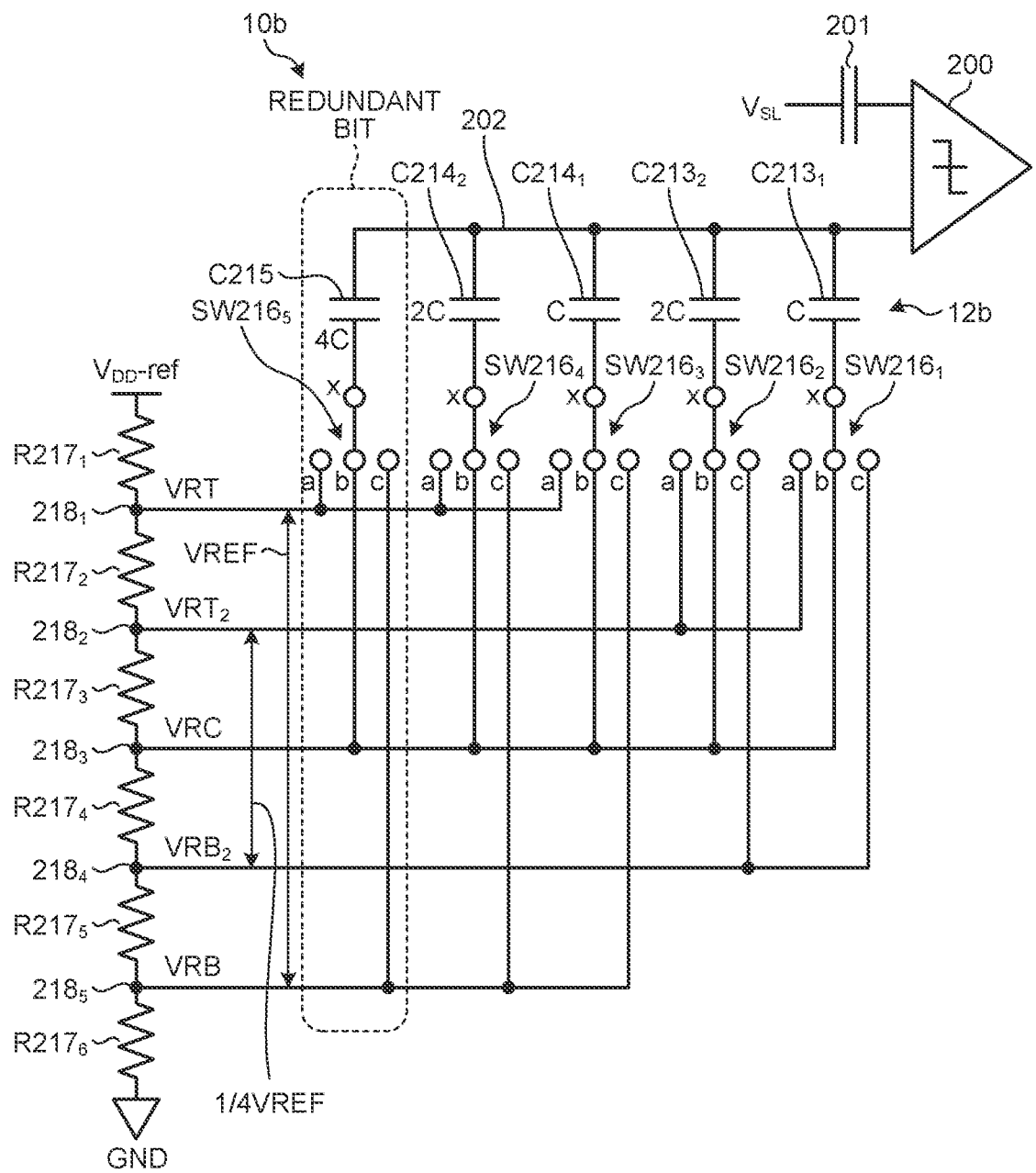
FIG. 4 is a diagram illustrating a successive approximation type AD converter according to an existing technique, the successive approximation type AD converter including a DA converter that obtains a plurality of reference voltages from a single voltage and further divides the obtained reference voltages into a plurality of systems.

FIG. 4 is a diagram illustrating an exemplary structure of a successive approximation type AD converter 10b according to an existing technique. The successive approximation type AD converter 10b includes a DA converter 12b that obtains, from the single voltage $V_{DD}$-ref, a plurality of reference voltages (the upper limit voltages VRT and $VRT_2$, the intermediate voltage VRC, and the lower limit voltages $VRB_2$ and VRB) and divides the obtained reference voltages into a plurality of systems.

Specifically, in the example illustrated in FIG. 4, the respective voltages obtained from the voltage $V_{DD}$-ref are divided into two systems, that is, a reference voltage system composed of the upper limit voltage VRT, the intermediate voltage VRC, and the lower limit voltage VRB, and a reference voltage system composed of the upper limit voltage $VRT_2$, the intermediate voltage VRC, and the lower limit voltage $VRB_2$. In FIG. 4, the stray capacitance of the connection line 202 is omitted.

In the successive approximation type AD converter 10b illustrated in FIG. 4, the upper limit voltages VRT and $VRT_2$, the intermediate voltage VRC, and the lower limit voltages $VRB_2$ and VRB, which are divided by the resistors $R217_1$ to $R217_6$ forming the ladder resistance circuit, are taken out from the connection points 2181 to 2185, respectively.

To one input end of the comparator 200, one ends of capacitors $C213_1$ and $C213_2$ used for generating the threshold voltage $V_{th}$ are connected via the connection line 202. The capacitors $C213_1$ and $C213_2$ have a capacitance C and a capacitance 2C, respectively, which increase in a binary manner (by two times). The capacitors $C213_1$ and $C213_2$ correspond to the conversion on the low order bit side in the AD conversion by the successive approximation type AD converter 10b.

To the one input end of the comparator 200, one ends of capacitors C214₁ and C214₂ that have the capacitance C and the capacitance 2C, respectively, in the same manner as the capacitors C213₁ and C213₂ are further connected via the connection line 202. The capacitors C214₁ and C214₂ correspond to the conversion on the high order bit side in the AD conversion by the successive approximation type AD converter 10b.

In the successive approximation type AD converter 10b, to the one input end of the comparator 200, a capacitor C215 having a capacitance 4C and being used for generating the threshold voltage $V_{th}$ is further connected via the connection line 202. The capacitor C215 is provided for a redundant bit.

The other ends of the capacitors C213₁, C213₂, C214₁, C214₂, and C215 are connected to the terminals x in the switches SW216₁ to SW216₅, respectively. The switches SW216₁ to SW216₅ are each controlled such that one of terminals a, b, and c is connected to the terminal x by a control signal output from the logic unit 15 (not illustrated).

In the example illustrated in FIG. 4, let a potential difference between the connection points 218₁ and 218₅ (the potential difference between the upper limit voltage VRT and the lower limit voltage VRB) be the voltage VREF, a potential difference between the connection points 2182 and 2184 (the potential difference between the upper limit voltage VRT₂ and the lower limit voltage VRB₂) is a voltage ¼VREF. The connection points 218₁ and 218₅ are connected to the terminals c of the switches SW216₃ to SW216₅. The connection points 218₂ and 218₄ are connected to the terminals c of the switches SW216₁ and SW216₂. The connection point 218₃ is connected to the terminal b of each of the switches SW216₁ to SW216₅.

In the structure illustrated in FIG. 4, the voltage used for generating the threshold voltage $V_{th}$ includes the two systems, that is, the reference voltage system corresponding to the voltage VREF applying the voltage to the capacitors C214₁, C214₂, and C215, and the reference voltage system corresponding to the voltage ¼VREF applying the voltage to the capacitors C213₁ and C213₂.

This structure allows the capacitors C213₁ and C213₂ in the voltage ¼VREF system and the capacitors C214₁ and C214₂ in the voltage VREF system to have the same capacitance, thereby making it possible to reduce the whole capacitance of the DA converter 12b. The capacitor C215 for the redundant bit needs to have a capacitance double of that of the capacitor C214₂. The capacitance of the capacitor C215, however, can be reduced because the capacitance of the capacitor C214₂ is the same as that of the capacitor C213₂ on the low order bit side.

The AD conversion operation based on the structure illustrated in FIG. 4 is the same as that described with reference FIG. 3. The description thereof is, thus, omitted.

Figure 5:
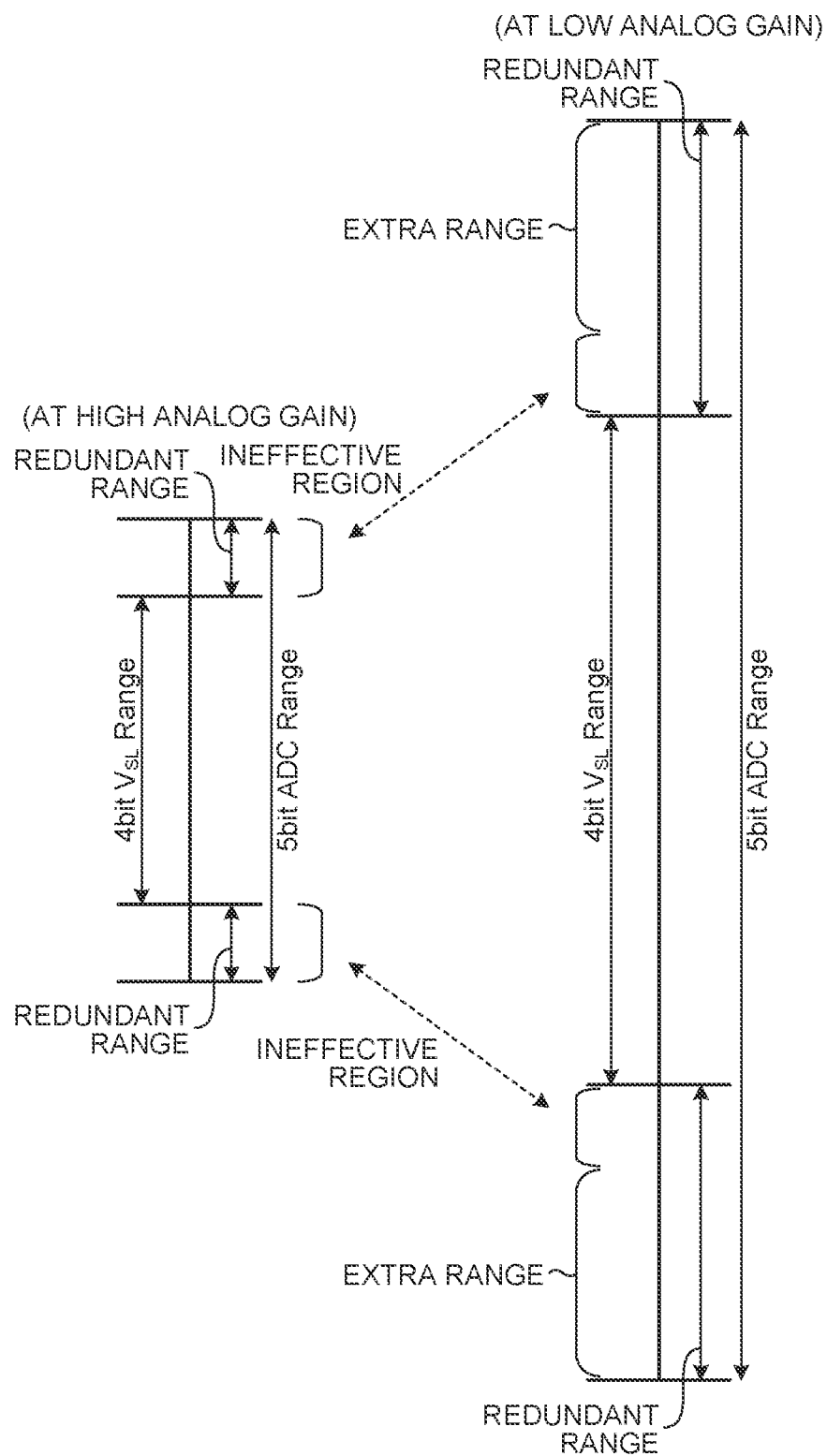
FIG. 5 is a diagram for explaining an AD conversion range in the structure in which the voltages included in the multiple systems are generated from the single voltage.

FIG. 5 is a diagram for explaining the AD conversion range in the structure illustrated in FIG. 4 in which the voltages included in the multiple systems are generated from the single voltage. On the left side in FIG. 5, an example of the AD conversion range when the analog gain is high (at a high analog gain) is illustrated. On the right side in FIG. 5, an example of the AD conversion range at a low analog gain is illustrated. In FIG. 5, the ineffective region, which is a value region due to characteristic variations of the pixels and the AD converter, cannot be used for the AD conversion. The ineffective region exists as a circuit characteristic regardless of the AD conversion range. The ineffective region has an equivalent value region both at the low analog gain and at the high analog gain. In general, the AD converters applied to image sensors have a redundant range in the AD conversion range so as to correspond to the value region of the ineffective region.

At the high analog gain, a small voltage range of the pixel signal $V_{SL}$ is AD converted into a necessary gradation (e.g., 4 bits). The value of 1LSB is small. At the low analog gain, a large voltage range of the pixel signal $V_{SL}$ is converted while the gradation of the AD conversion is not changed. The value of 1LSB is large. In FIG. 5, 1LSB at the high analog gain and 1LSB at the low analog gain are comparatively illustrated on the left and the right sides.

In the successive approximation type AD converter 10b illustrated in FIG. 4, in each of the switches SW216₁ to SW216₅, the terminal b is connected to the terminal x, thereafter, the connection is switched such that the terminal a is connected to the terminal x, for example. As a result, a voltage (⅛VREF), which is a difference between the intermediate voltage VRC and the upper limit voltage VRT₂, is applied to the capacitors C213₁ and C213₂, resulting in the threshold voltage $V_{th}$ being increased. To the capacitors C214₁, C214₂, and C215, a voltage (½VREF), which is a difference between the intermediate voltage VRC and the upper limit voltage VRT, is applied, resulting in the threshold voltage $V_{th}$ being increased.

At the low analog gain, in each of the switches SW216₁ to SW216₅, the terminal c is connected to the terminal x, thereafter, the connection is switched such that the terminal a is connected to the terminal x, for example. As a result, the voltage ¼VREF is applied to the capacitors C213₁ and C213₂ while the voltage VREF is applied to the capacitors C214₁, C214₂, and C215.

In the successive approximation type AD converter 10b illustrated in FIG. 4, the multiple reference voltages (the upper limit voltages VRT and VRT₂, the intermediate voltage VRC, and the lower limit voltages VRB and VRB₂) are generated from the single voltage VDD-ref. At the high analog gain, the redundant range is seen large with respect to an effective signal region (obit $V_{SL}$ Range), the range of the AD converter is set in such a manner to include a range combining the effective signal region and the redundant range at the high analog gain so as to secure the necessary AD conversion gradation at any analog gain (5 bit ACDC Range). As a result, a redundant range including an extra range and the value region of the ineffective region is set at the low analog gain (refer to the right side in FIG. 5), resulting in the value of the voltage VREF being increased.

In the structure illustrated in FIG. 4, when the capacitances connected to the upper limit voltages VRT and VRT₂, and the lower limit voltages VRB and VRB₂ are connected to the intermediate voltage VRC for resetting the DA converter 12b, and when the capacitances are connected to the upper limit voltages VRT and VRT₂, and the lower limit voltages VRB and VRB₂ from the intermediate voltage VRC in accordance with the control signal from the logic unit 15, the charges of the capacitances are charged and discharged via the switches SW216₁ to SW216₄ and the resistors R217₁ to R217₆ forming the ladder resistance circuit. The structure illustrated in FIG. 3 also operates likewise. As a result, a settling time of the DA converter 12b is determined by the resistances and the capacitances of the charge-discharge path. Particularly, the connection point 218₃, from which the intermediate voltage VRC is taken out and which is the intermediate node of the ladder resistance circuit composed of the resistors R217₁ to R217₆, has a high output impedance. As a result, the settling time of the DA conversion is large.

Figure 6:
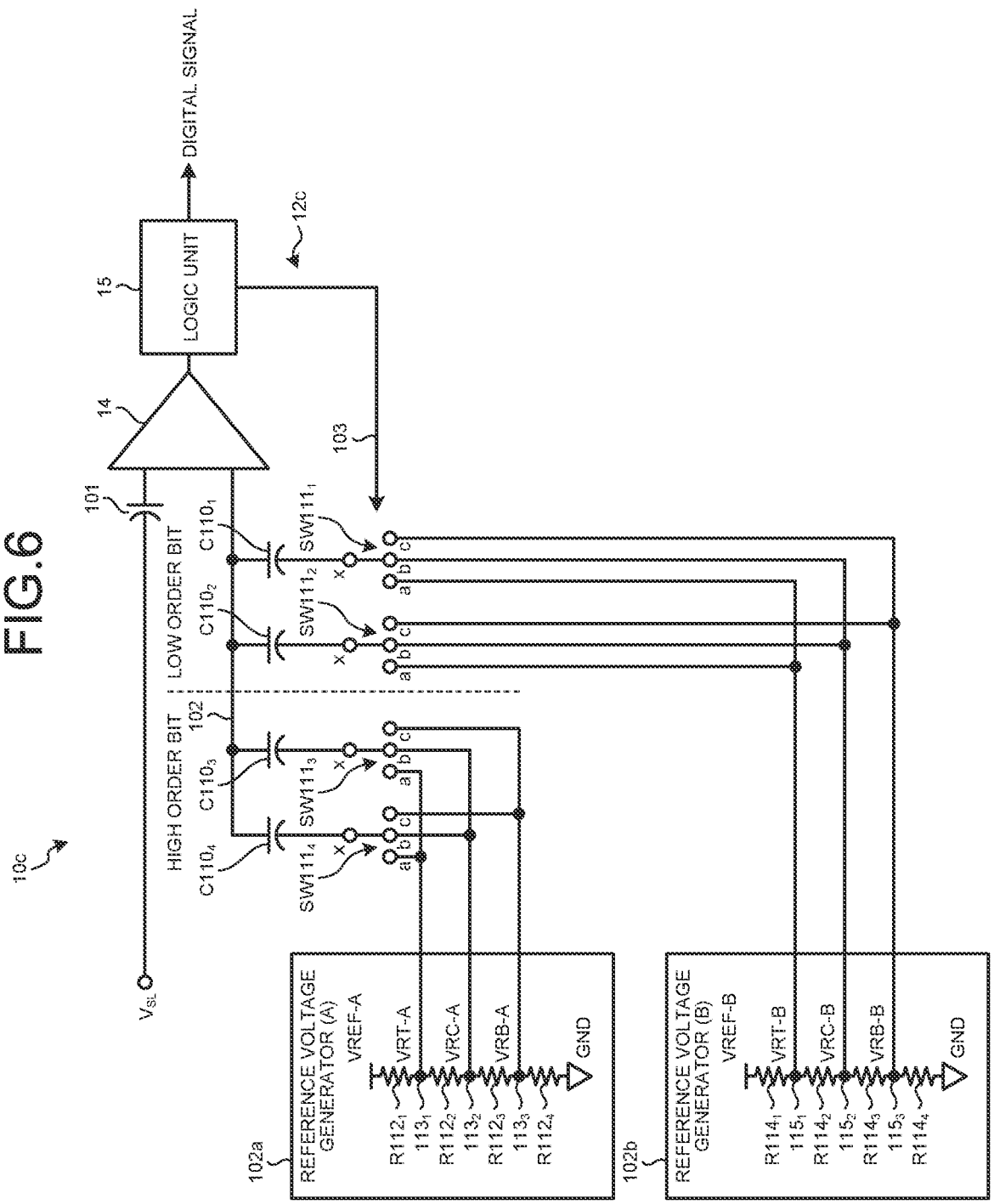
FIG. 6 is a diagram illustrating an exemplary basic structure of a successive approximation type AD converter according to the first embodiment.

Exemplary structure of successive approximation type AD converter according to the first embodiment and exemplary processing thereby The following describes an exemplary structure of a successive approximation type AD converter according to the first embodiment and exemplary processing thereby. FIG. 6 is a diagram illustrating an exemplary basic structure of the successive approximation type AD converter according to the first embodiment. In FIG. 6, this successive approximation type AD converter 10c, which corresponds to each of the successive approximation type AD converters $10_1$, $10_2$, ..., $10_{n-1}$, and $10_n$ illustrated in FIG. 2, includes a plurality of structures each of which generates a plurality of voltages for setting the threshold voltage $V_{th}$. The multiple structures each can perform voltage control independently.

In the example illustrated in FIG. 6, the successive approximation type AD converter 10c includes a DA converter 12c, the comparator 14, the logic unit 15, a coupling capacitor 101, and reference voltage generators 102a and 102b. The DA converter 12c includes capacitors $C110_1$, $C110_2$, $C110_3$, and $C110_4$, and switches $SW111_1$, $111_2$, $111_3$, and $111_4$. In FIG. 6, the preamplifier unit 13 illustrated in FIG. 2 is omitted. In FIG. 6, the stray capacitance of a connection line 102 is omitted.

The reference voltage generator 102a outputs a voltage VREF-A and generates an upper limit voltage VRT-A, an intermediate voltage VRC-A, and a lower limit voltage VRB-A on the basis of the voltage VREF-A. The reference voltage generator 102b outputs a voltage VREF-B and generates an upper limit voltage VRT-B, an intermediate voltage VRC-B, and a lower limit voltage VRB-B on the basis of the voltage VREF-B. In FIG. 6, the reference voltage generators 102a and 102b are also denoted as a reference voltage generator (A) and a reference voltage generator (B), respectively.

In the reference voltage generator 102a, the voltage VREF-A is supplied to one ends of resistors $R112_1$, $R112_2$, $R112_3$, and $R112_4$ that form a ladder resistance circuit while the other ends of the resistors $R112_1$, $R112_2$, $R112_3$, and $R112_4$ have ground potential (GND). The upper limit voltage VRT-A, the intermediate voltage VRC-A, and the lower limit voltage VRB-A are taken out from connection point $113_1$, $113_2$, and $113_3$, respectively, connecting the resistors $R112_1$, $R112_2$, $R112_3$ and $R112_4$.

In the example illustrated in FIG. 6, the reference voltage generator 102b has the same structure as the reference voltage generator 102a. In the reference voltage generator 102b, the voltage VREF-B is supplied to the one ends of resistors $R114_1$, $R114_2$, $R114_3$, and $R114_4$ that form the ladder resistance circuit while the other ends of the resistors $R114_1$, $R114_2$, $R114_3$, and $R114_4$ have the ground potential (GND). The upper limit voltage VRT-B, the intermediate voltage VRC-B, and the lower limit voltage VRB-B are taken out from connection point $115_1$, $115_2$, and $115_3$, respectively, connecting the resistors $R114_1$, $R114_2$, $R114_3$ and $R114_4$.

The capacitors $C110_1$ and $C110_2$, each of which is used for generating the threshold voltage $V_{th}$, have a capacitance C and a capacitance 2C, respectively, the capacitance C and the capacitance 2C increasing in a binary manner, for example. To one input end of the comparator 14, one ends of the capacitors $C110_1$ and $C110_2$ are connected via the connection line 102. The capacitors $C110_1$ and $C110_2$ correspond to the conversion on the low order bit side in the AD conversion by the successive approximation type AD converter 10c.

To the one input end of the comparator 14, one ends of the capacitors $C110_3$ and $C110_4$ are further connected via the connection line 102. The capacitors $C110_3$ and $C110_4$ have the capacitance C and the capacitance 2C, respectively, in the same manner as the capacitors $C110_1$ and $C110_2$. The capacitors $C110_3$ and $C110_4$ correspond to the conversion on the high order bit side in the AD conversion by the successive approximation type AD converter 10c.

The low order bit side is a low order side (LSB side) of a certain bit position of the bit, for each bit after conversion by the AD conversion. The high order bit side is the bit at a certain bit position and a high order side (MSB side) of the bit, for each bit after conversion by the AD conversion.

The other ends of the capacitors $C110_1$, $C110_2$, $C110_1$, and $C110_2$ are connected to the terminals x of the switches $SW111_1$ to $SW111_4$, respectively. The switches $SW111_1$ to $SW111_4$ are controlled by a control signal 103 output from the logic unit 15 such that one of the terminals a, b, and c is connected to the terminal x.

To the terminals a, b, and c of each of the switches $SW111_1$ and $SW111_2$, the connection points $115_3$, $115_2$, and $115_1$ in the reference voltage generator 102b are connected, respectively. As a result, to the terminals a, b, and c of each of the switches $SW111_1$ and $SW111_2$, the upper limit voltage VRT-B, the intermediate voltage VRC-B, and the lower limit voltage VRB-B that are output from the reference voltage generator 102b are supplied, respectively.

In the same manner as described above, to the terminals a, b, and c of each of the switches $SW111_3$ and $SW111_4$, the connection points $113_3$, $113_2$, and $113_1$ in the reference voltage generator 102a are connected, respectively. As a result, to the terminals a, b, and c of each of the switches $SW111_3$ and $SW111_4$, the upper limit voltage VRT-A, the intermediate voltage VRC-A, and the lower limit voltage VRB-A that are output from the reference voltage generator 102a are supplied, respectively.

As described above, the successive approximation type AD converter 10c according to the first embodiment performs generation and supply of the upper limit voltage VRT, the intermediate voltage VRC, and the lower limit voltage VRB using the two systems, that is, the reference voltage generators 102a and 102b.

Figure 7:
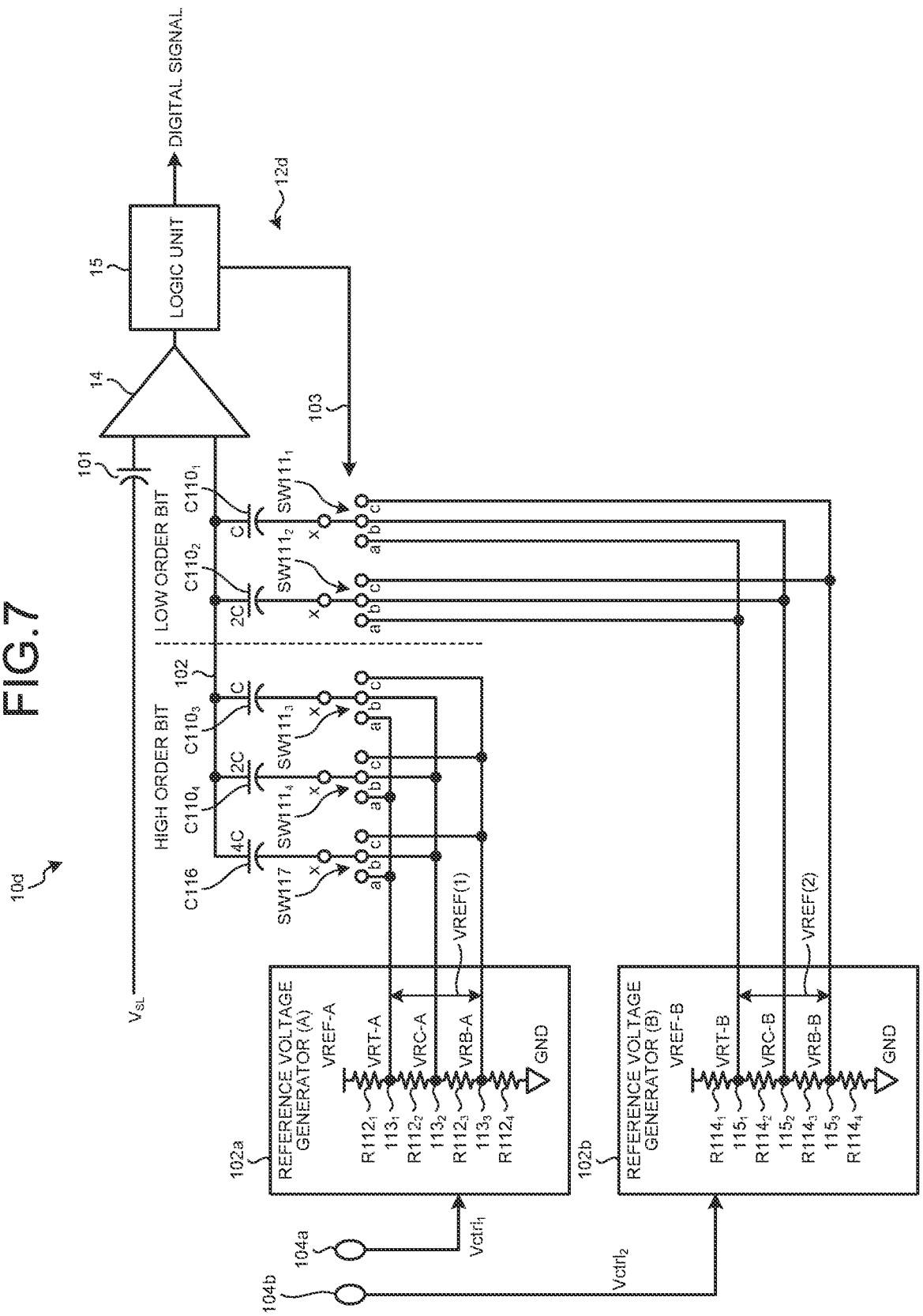
FIG. 7 is a diagram illustrating a more concrete structural example of the successive approximation type AD converter according to the first embodiment.

FIG. 7 is a diagram illustrating a more concrete structural example of the successive approximation type AD converter according to the first embodiment. A successive approximation type AD converter 10d illustrated in FIG. 7 includes a capacitor C116 and a switch SW117 in addition to the structure of the successive approximation type AD converter 10c illustrated in FIG. 6. The capacitor C116 has a capacitance 4C, the capacitance being increased in a binary manner from that of the capacitor $C110_4$ having a capacitance 2C and corresponding to the high order side bit. One end of the capacitor C116 is connected to the other input end of the comparator 14 via the connection line 102. The other end of the capacitor C116 is connected to the terminal x of the switch SW117.

To the terminals a, b, and c of the switch SW117, the connection points $113_3$, $113_2$, and $113_1$ of the reference voltage generator 102a are connected, respectively. As a result, to the terminals a, b, and c of the switch SW117, the upper limit voltage VRT-A, the intermediate voltage VRC-A, and the lower limit voltage VRB-A that are output from the reference voltage generator 102a are supplied, respectively.

From the outside of the successive approximation type AD converter 10d, voltage control signals $Vctrl_1$ and $Vctrl_2$ are supplied to terminals 104a and 104b, respectively. The voltage control signals $Vctrl_1$ and $Vctrl_2$ are supplied from the control unit 1002, for example.

The voltage control signal $Vctrl_1$ controls the voltage VREF-A generated by the reference voltage generator 102a. The voltage values of the upper limit voltage VRT-A, the intermediate voltage VRC-A, and the lower limit voltage VRB-A that are generated by the reference voltage generator 102a are, thus, controlled by the voltage control signal $Vctrl_1$. In the same manner as described above, the voltage control signal $Vctrl_2$ controls the voltage VREF-B generated in the reference voltage generator 102b, thereby controlling the voltage values of the upper limit voltage VRT-B, the intermediate voltage VRC-B, and the lower limit voltage VRB-B.

As described above, the successive approximation type AD converter 10d according to the first embodiment has the two systems for generating the threshold voltage $V_{th}$ and can independently control the respective voltages output in the respective systems.

Figure 8:
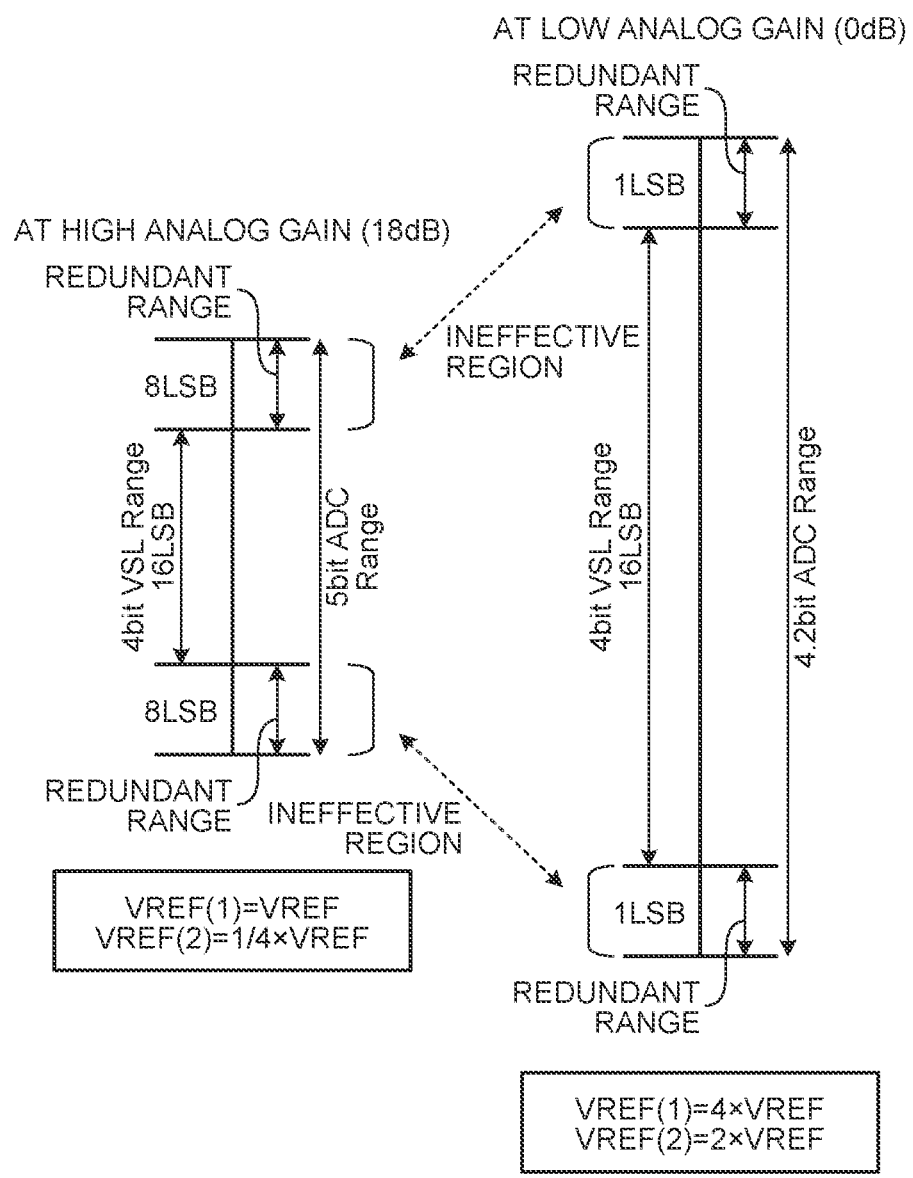
FIG. 8 is a diagram for explaining the AD conversion range in the successive approximation type AD converter according to the first embodiment.

FIG. 8 is a diagram for explaining the AD conversion range in the successive approximation type AD converter illustrated in FIG. 7 according to the first embodiment. The terms illustrated in FIG. 8 have the same meanings as those in FIG. 5. The descriptions thereof are omitted.

At the high analog gain, a small voltage range of the pixel signal $V_{SL}$ is AD converted into a necessary gradation (e.g., 4 bits). The value of 1LSB is small. At the low analog gain, a large voltage range of the pixel signal $V_{SL}$ is converted while the gradation of the AD conversion is not changed. The value of 1LSB is large.

With reference to FIG. 7, a potential difference between the upper limit voltage VRT-A and the lower limit voltage VRB-A is a voltage VREF (1) in the reference voltage generator 102a while a potential difference between the upper limit voltage VRT-B and the lower limit voltage VRB-B is a voltage VREF (2) in the reference voltage generator 102b. The voltage VREF is equal to the voltage VREF (1).

At the high analog gain (18 dB) on the left side in FIG. 8, the voltages VREF-A and VREF-B are adjusted to satisfy that the voltage VREF (2)=¼×VREF. At the low analog gain, the voltages VREF-A and VREF-B are adjusted to satisfy that the voltage VREF (1)=4×VREF. As a result, the AD conversion range at the high analog gain and the AD conversion range at the low analog gain that are illustrated in FIG. 8 can be achieved.

In the example illustrated in FIG. 8, for the redundant range serving as the common ineffective region at the low analog gain and the high analog gain, 1LSB is allocated at the low analog gain while 8LSB is allocated at the high analog gain. As a result, the necessary range of the AD converter at the high analog gain is 5 bits while the range of the AD converter at the low analog gain is 4.2 bits.

In the example illustrated in FIG. 7, when the voltage value of the voltage VREF-A that is in the reference voltage generator 102a system and corresponds to the high order bit side is changed from four times to two times of the voltage value of the voltage VREF-B on the low order bit side, the amplitude of the final bit of the high order bit (the least significant bit on the high order bit side) becomes equal to the amplitude of the top bit of the low order bit (the most significant bit on the low order bit side). As a result, the final bit of the high order bit and the top bit of the low order bit overlap with each other. The top bit of the low order bit can be used as the redundant bit. In this case, a dynamic range (the AD conversion range) is half that before the change. In the structure illustrated in FIG. 7, a voltage value setting width of the voltage VREF-A output by the reference voltage generator 102a may be set to any voltage value equal to or smaller than four times of the voltage value of the voltage VREF-B output by the reference voltage generator 102b.

In the structure illustrated in FIG. 7, when the top bit on the low order bit side is the redundant bit, the redundant bit becomes an effective bit by setting the voltage value of the voltage VREF-A, which is the output voltage of the reference voltage generator 102a system, to a voltage value four times of the voltage value of the voltage VREF-B, which is the output voltage of the reference voltage generator 102b system corresponding to the low order bit side. As a result, the dynamic range is doubled.

The successive approximation type AD converter 10d according to the first embodiment has the two systems each of which independently generates and outputs the voltages used for setting the threshold voltage $V_{th}$. This makes it possible to dynamically control the dynamic range of the AD conversion while 1LSB is maintained without change in the number of conversion bits determined by the circuit structure and change in the structure of the capacitive DA converter. As a result, the range of the necessary reference voltage is reduced, thereby making it possible to reduce the reference voltage.

In the successive approximation type AD converter 10d according to the first embodiment, the reference voltage generator 102a generates the reference voltages on the high order bit side, and the reference voltage generator 102b generates the reference voltages on the low order bit side, resulting in charges being supplied to the capacitances for the respective bits in the DA converter 12d. This reduces loads of the reference voltage generators 102a and 102b as compared with a case where all capacitances are connected to a single system reference voltage generator. As a result, settling is improved.

A case is examined where a current flowing in the resistors $R112_1$ to $R112_4$ that form the ladder resistance circuit in the reference voltage generator 102a on the high order bit side, and a current flowing in the resistors $R114_1$ to $R114_4$ that form the ladder resistance circuit in the reference voltage generator 102b on the low order bit side are equal. In this case, in the example illustrated in FIG. 7, the resistance value of the resistors $R114_1$ to $R114_4$ is one fourth of the resistance value of the resistors $R112_1$ to $R112_4$ because the voltage value of the voltage VREF-B generated by the reference voltage generator 102b is one fourth of the voltage value of the voltage VREF-A generated by the reference voltage generator 102a. The output impedance viewed from the respective connection points $115_1$ to $115_3$ can be reduced, thereby improving the settling at low order bit transition.

When the successive approximation type AD converter 10d is applied to an imaging device, the low analog gain and the high analog gain can be set by the exposure control by the control unit 1002 in accordance with the value of the digital signal output of the successive approximation type AD converter 10d, for example. For example, when a subject is dark, the analog gain is set to be high to increase an exposure time while when a subject is bright, the analog gain is set to be low to reduce the exposure time. As a possible example of such a case, the low analog gain is set when an average of luminance values calculated on the basis of the values obtained by the AD conversion of the analog pixel signals of all pixels included in the pixel array unit 2 is equal to or larger than a predetermined value while the high analog gain is set when the average is smaller than the predetermined value.

Determination Error Correction Using Redundant bit

Figure 9A:
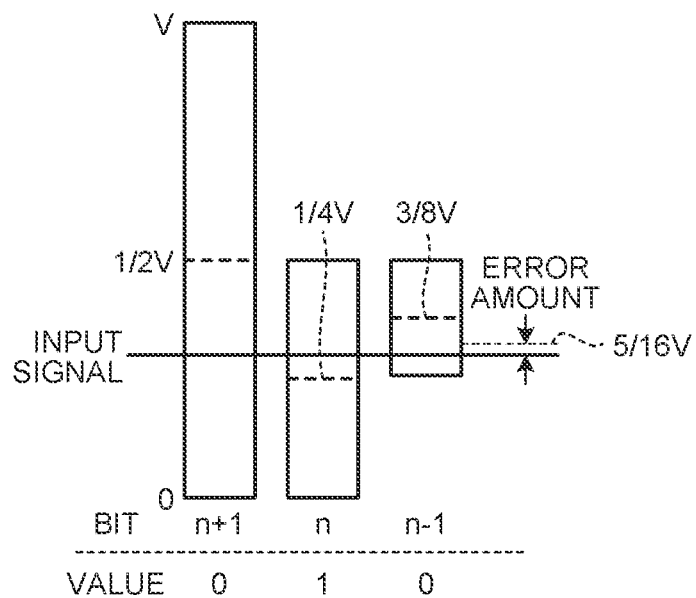
FIG. 9A is a diagram for roughly explaining determination error correction using a redundant bit, the determination error correction being applicable to the first embodiment.
Figure 9B:
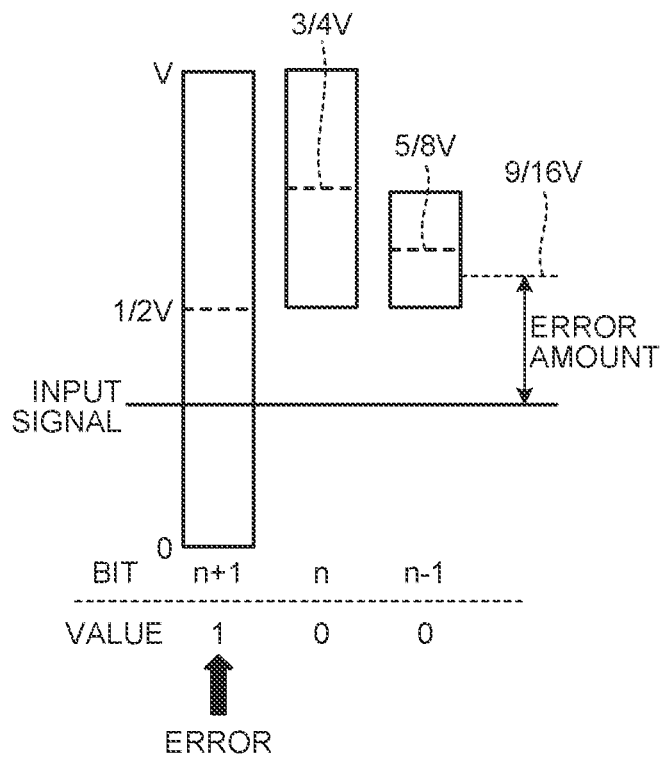
FIG. 9B is a diagram for roughly explaining the determination error correction using the redundant bit, the determination error correction being applicable to the first embodiment.
Figure 9C:
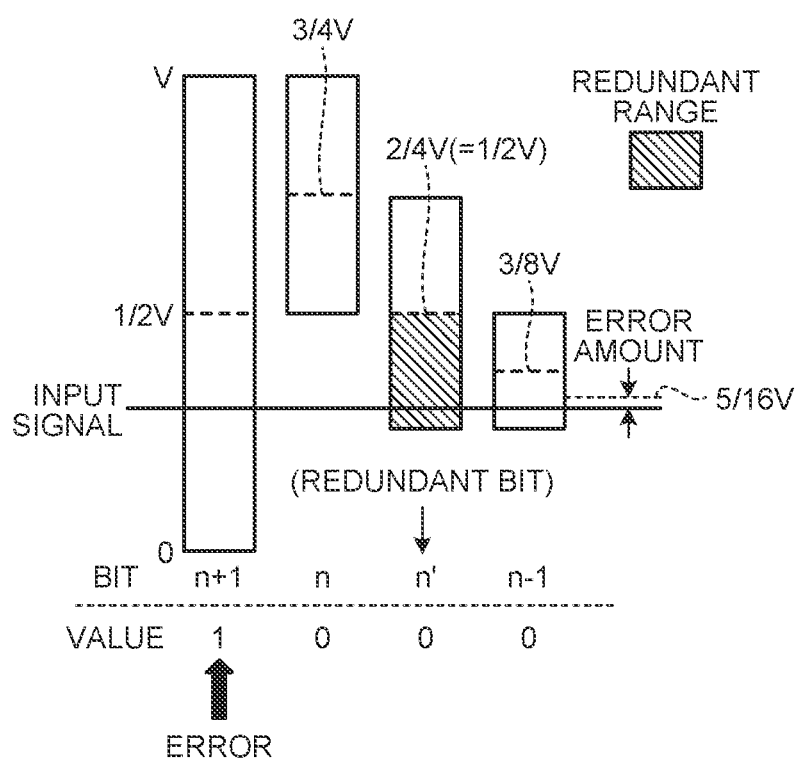
FIG. 9C is a diagram for roughly explaining the determination error correction using the redundant bit, the determination error correction being applicable to the first embodiment.

The following roughly describes determination error correction using the redundant bit, the determination error correction being applicable to the first embodiment. FIGS. 9A and 9B illustrate examples when the redundant bit is not used. FIG. 9C illustrates an example when the redundant bit is used.

In FIGS. 9A to 9C, the lower limit voltage VRB=0, the upper limit voltage VRT=V, and an analog voltage value of the input signal is converted into a digital value represented by 3 bits, for the purpose of explanation. For each bit, the threshold voltage $V_{th}$ used for determination of the bit is indicated with the dotted line, and the solid line frame having the dotted line as its center indicates a determination range used for determination of the threshold voltage $V_{th}$ by the comparator 14, for example.

The successive approximation type AD converter compares a comparison target with the threshold voltage $V_{th}$. For example, when the comparison target>the threshold voltage $V_{th}$, the bit value is set to be "1" while when the comparison target<the threshold voltage $V_{th}$, the bit value is set to be "0". When the bit value is "1", the threshold voltage $V_{th}$ for the next bit (the bit lower by one bit with respect to the previous bit) is obtained as $V_{pre}+\frac{1}{2} \times V_{pre}$ where $V_{pre}$ is the previous threshold voltage $V_{th}$. When the bit value is "0", the threshold voltage $V_{th}$ for the next bit is obtained as $V_{pre}-\frac{1}{2} \times V_{pre}$. In the successive approximation type AD converter, the threshold voltage $V_{th}$ is set in accordance with a conversion history of the bit having been converted before the bit serving as a conversion target.

FIG. 9A illustrates an example of the AD conversion when no bit determination error exists. At bit (n+1), the comparison target and the threshold voltage $V_{th}=\frac{1}{2}V$ are compared. The value of bit (n+1) is set to be "0" because "the threshold voltage $V_{th}$>the comparison target". The threshold voltage $V_{th}$ for next bit n is obtained as $V_{th}=\frac{1}{2}V-\frac{1}{2} \times (\frac{1}{2}V)=\frac{1}{4}V$. At bit n, the comparison target and the threshold voltage $V_{th}=\frac{1}{4}V$ are compared. The value of the bit n is set to be "1" because "the threshold voltage $V_{th}$<the comparison target". The threshold voltage $V_{th}$ for next bit n is obtained as $V_{th}=\frac{1}{4}V+\frac{1}{2} \times (\frac{1}{4}V)=\frac{3}{8}V$. At bit (n−1), the comparison target and the threshold voltage $V_{th}=\frac{3}{8}V$ are compared. The value of bit (n−1) is set to be "0" because "the threshold voltage $V_{th}$>the comparison target". The AD conversion result of the comparison target is obtained as "010", which is represented by 3 bits.

In accordance with the determination result that "the threshold voltage $V_{th}$>the comparison target" of bit (n−1), the threshold voltage $V_{th}$ for next bit (n−2) (not illustrated) is calculated as $V_{th}=\frac{3}{8}V+\frac{1}{2} \times (\frac{3}{8}V)=\frac{5}{16}V$. A difference between the threshold voltage $V_{th}=\frac{5}{16}V$ and the voltage value of the comparison target is a conversion error. In this case, the error factor of the conversion error is a quantization error.

FIG. 9B illustrates an example when the determination error occurs at bit (n+1) in the determination in FIG. 9A and the bit value is set to be "1". In this case, the threshold voltage $V_{th}$ for next bit n is obtained as $V_{th}=\frac{1}{2}V+\frac{1}{2} \times (\frac{1}{2}V)=\frac{3}{4}V$. The value of bit n is set to be "0" because "the threshold voltage $V_{th}$>the comparison target". The threshold voltage $V_{th}$ for next bit (n−1) is obtained as $V_{th}=\frac{3}{4}V+\frac{1}{2} \times (\frac{3}{4}V)=\frac{5}{8}V$. The value of bit (n−1) is set to be "0" because "the threshold voltage $V_{th}$>the comparison target". In this case, the AD conversion result of the comparison target is "100", which differs from the value of the example in FIG. 9A.

In accordance with the determination result that "the threshold voltage $V_{th}$>the comparison target" of bit (n−1), the threshold voltage $V_{th}$ for next bit (n−2) (not illustrated) is calculated as $V_{th}=\frac{5}{8}V+\frac{1}{2} \times (\frac{5}{8}V)=\frac{9}{16}V$. A difference between the threshold voltage $V_{th}=\frac{9}{16}V$ and the voltage value of the comparison target is the conversion error. From FIG. 9B, it is understood that the conversion error becomes larger than that of the example in FIG. 9A.

FIG. 9C illustrates an example where a determination using the redundant bit n' is applied to bit n in the example where the determination error occurs on bit (n+1) in FIG. 9B. In FIG. 9C, the redundant range of the redundant bit n' is indicated with oblique lines. The redundant bit can reduce the determination error by 0.5×redundant bit weight. In the example illustrated in FIG. 9C, determination is performed by expanding the determination range with the redundant range by half the determination range of bit n, in relation to the determination error on bit (n+1) in FIG. 9B.

In FIG. 9C, the threshold voltage $V_{th}$ for bit n' (redundant bit) is changed to $\frac{1}{2}V$ from $\frac{3}{4}V$, which is the threshold voltage $V_{th}$ for bit n, which is the previous bit of bit n'. In this case, the value of bit n' is set to be "0" because "the threshold voltage $V_{th}$>the comparison target". The threshold voltage $V_{th}$ for next bit (n−1) is obtained as $V_{th}=\frac{1}{2}V-\frac{1}{2} \times (\frac{1}{2}V)=\frac{3}{8}V$. The value of bit n is set to be "0" because "the threshold voltage $V_{th}$>the comparison target". In this case, the result of the AD conversion of the comparison target is "100" based on the employment of the determination result according to the redundant bit n'.

In accordance with the determination result that "the threshold voltage $V_{th}$>the comparison target" of bit (n−1), the threshold voltage $V_{th}$ for next bit (n−2) (not illustrated) is calculated as $V_{th}=\frac{3}{8}V+\frac{1}{2} \times (\frac{3}{8}V)=\frac{5}{16}V$. A difference between the threshold voltage $V_{th}=\frac{5}{16}V$ and the voltage value of the comparison target is the conversion error. As illustrated in FIG. 9C, the conversion error is smaller than that of the example illustrated in FIG. 9B and is equal to that of the case where no error occurs illustrated in FIG. 9A.

More concrete example of AD conversion according to the first embodiment

Figure 10:
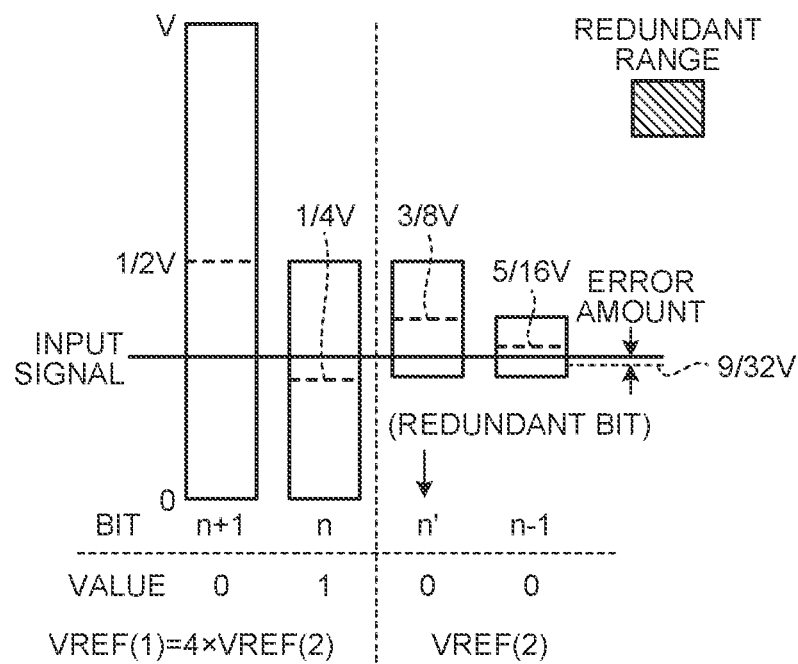
FIG. 10 is a diagram illustrating an example of the AD conversion that can achieve high resolution and is applicable to the first embodiment.
Figure 11:
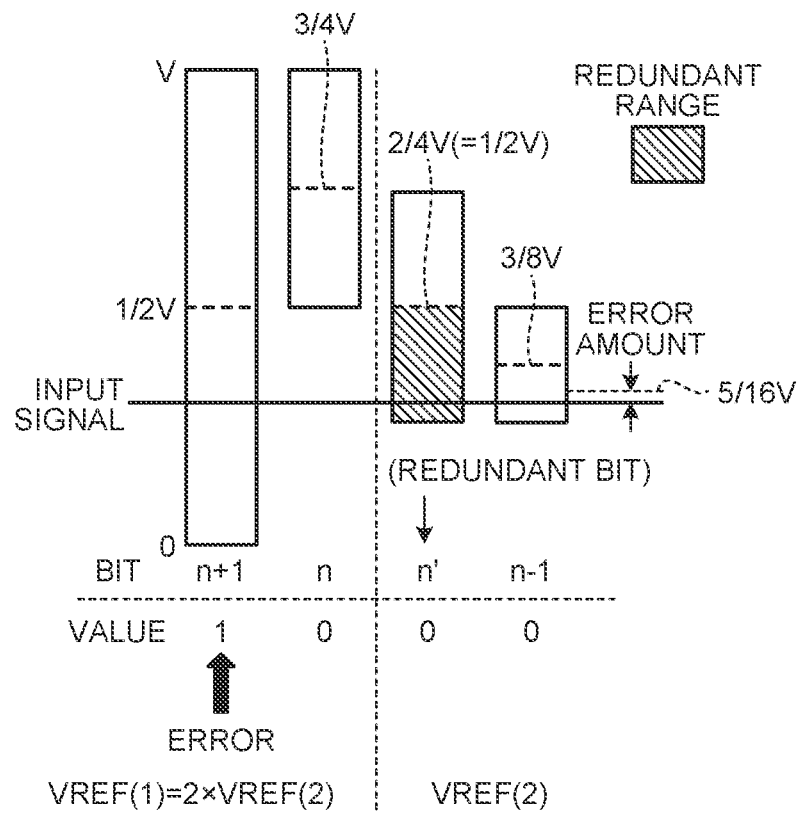
FIG. 11 is a diagram illustrating an example where the AD conversion is performed by expanding a redundant range, the AD conversion being applicable to the first embodiment.

The following describes a more concrete example of the AD conversion according to the first embodiment with reference to FIGS. 10 and 11. In the successive approximation type AD converter 10d according to the first embodiment, when the reference voltage range is minimized as illustrated in FIG. 8, the number of bits of the successive approximation type AD converter 10d is an integer that can include necessary AD conversion range. At the low analog gain illustrated on the left side in FIG. 8, the necessary AD conversion range is 4.2 bits. The successive approximation type AD converter 10d has the AD conversion range of 5 bits. The difference of 0.8 bits can be allocated as the redundant bit. FIGS. 10 and 11 are examples that can achieve high resolution and redundant range expansion by switching of reference voltage ranges in the AD conversion according to the first embodiment. The terms illustrated in FIGS. 10 and 11 have the same meanings as those in FIGS. 9A to 9C. The descriptions thereof are omitted.

FIG. 10 is a diagram illustrating an example of the AD conversion that can achieve high resolution and is applicable to the first embodiment. FIG. 10 illustrates an example of the AD conversion that achieves high resolution using all bits as the effective bits with a condition where the voltage VREF (1) serving as the reference voltage on the high order bit side is four times as large as VREF (2) serving as the reference voltage on the low order bit side. FIG. 10 illustrates an example of the AD conversion where no bit determination error occurs.

At bit (n+1) in FIG. 10, the comparison target and the threshold voltage $V_{th}=\frac{1}{2}V$ are compared. The value of bit (n+1) is set to be "0" because "the threshold voltage $V_{th}>$the comparison target". The threshold voltage $V_{th}$ for next bit n is obtained as $V_{th}=\frac{1}{2}V-\frac{1}{2}\times(\frac{1}{2}V)=\frac{1}{4}V$. At bit n, the comparison target and the threshold voltage $V_{th}=\frac{1}{4}V$ are compared. The value of bit n is set to be "1" because "the threshold voltage $V_{th}<$the comparison target". The threshold voltage $V_{th}$ for next bit n' is obtained as $V_{th}=\frac{1}{4}V+\frac{1}{2}\times(\frac{1}{4}V)=\frac{3}{8}V$. At bit n', the comparison target and the threshold voltage $V_{th}=\frac{3}{8}V$ are compared. The value of bit n' is set to be "0" because "the threshold voltage $V_{th}>$the comparison target". The threshold voltage $V_{th}$ for next bit (n−1) is obtained as $V_{th}=\frac{3}{8}V-\frac{1}{2}\times(\frac{3}{4}V)=\frac{5}{16}V$. At bit (n−1), the comparison target and the threshold voltage $V_{th}=\frac{5}{16}V$ are compared. The value of bit (n−1) is set to be "0" because "the threshold voltage $V_{th}>$the comparison target". The AD conversion result of the comparison target is obtained as "0100", which is represented by 4 bits.

In accordance with the determination result that "the threshold voltage $V_{th}>$the comparison target" of bit (n−1), the threshold voltage $V_{th}$ for next bit (n−2) (not illustrated) is calculated as $V_{th}=\frac{5}{16}V+\frac{1}{2}\times(\frac{5}{16}V)=\frac{9}{32}V$. A difference between the threshold voltage $V_{th}=\frac{9}{32}V$ and the voltage value of the comparison target is a conversion error.

FIG. 11 is a diagram illustrating an example where the AD conversion is performed by expanding the redundant range, the AD conversion being applicable to the first embodiment. FIG. 11 illustrates an example of the AD conversion when the redundant range is expanded by widening the overlapping range of the reference voltages generated by the reference voltage generators 102a and 102b with a condition where the voltage VREF (1) serving as the reference voltage on the high order bit side is twice as large as the voltage VREF (2) serving as the reference voltage on the low order bit side. In this case, 1 bit out of 4 bits of the AD conversion range is allocated as the redundant bit. FIG. 11 illustrates an example of the AD conversion when a bit determination error exists and the determination error is corrected by the redundant bit.

FIG. 11 illustrates an example where the determination using the redundant bit n' is applied to bit n in the example where the determination error occurs on bit (n+1). In the example illustrated in FIG. 11, the determination is performed by expanding the determination range with the redundant range by half the determination range of bit n, in relation to the determination error on bit (n+1).

In FIG. 11, the determination error occurs on bit (n+1), and the bit value, which is originally determined to be "0", is determined to be "1". In this case, the threshold voltage $V_{th}$ for next bit n is obtained as $V_{th}=\frac{1}{2}V+\frac{1}{2}\times(\frac{1}{2}V)=\frac{3}{4}V$. The value of bit n is set to be "0" because "the threshold voltage $V_{th}>$the comparison target".

The threshold voltage $V_{th}$ for next bit n'(the redundant bit n') is obtained as $V_{th}=\frac{1}{2}V$, and the value of bit n' is set to be "0" because "the threshold voltage $V_{th}>$the comparison target". The threshold voltage $V_{th}$ for next bit (n−1) is obtained as $V_{th}=\frac{1}{2}V-\frac{1}{2}\times\frac{1}{2}\times(\frac{1}{2}V)=\frac{3}{8}V$. The value of bit n bit is set to be "0" because "the threshold voltage $V_{th}>$the comparison target". In this case, the result of the AD conversion of the comparison target is "100" based on the employment of the determination result according to the redundant bit n'.

In accordance with the determination result that "the threshold voltage $V_{th}>$the comparison target" of bit (n−1), the threshold voltage $V_{th}$ for next bit (n−2) (not illustrated) is calculated as $V_{th}=\frac{3}{8}V+\frac{1}{2}\times(\frac{3}{8}V)=\frac{5}{16}V$. A difference between the threshold voltage $V_{th}=\frac{5}{16}V$ and the voltage value of the comparison target is a conversion error.

As described above, the successive approximation type AD converter 10d according to the first embodiment generates the reference voltages of two systems by the reference voltage generators 102a and 102b each of which allows the voltages to be controlled, thereby making it possible to switch high resolution and expansion of the redundant range. The AD conversion can be performed adaptively in accordance with the use such as the use at the high analog gain or the use at the low analog gain.

Reduction of Variance of Reference Voltage Among Multiple Systems

Figure 12A:
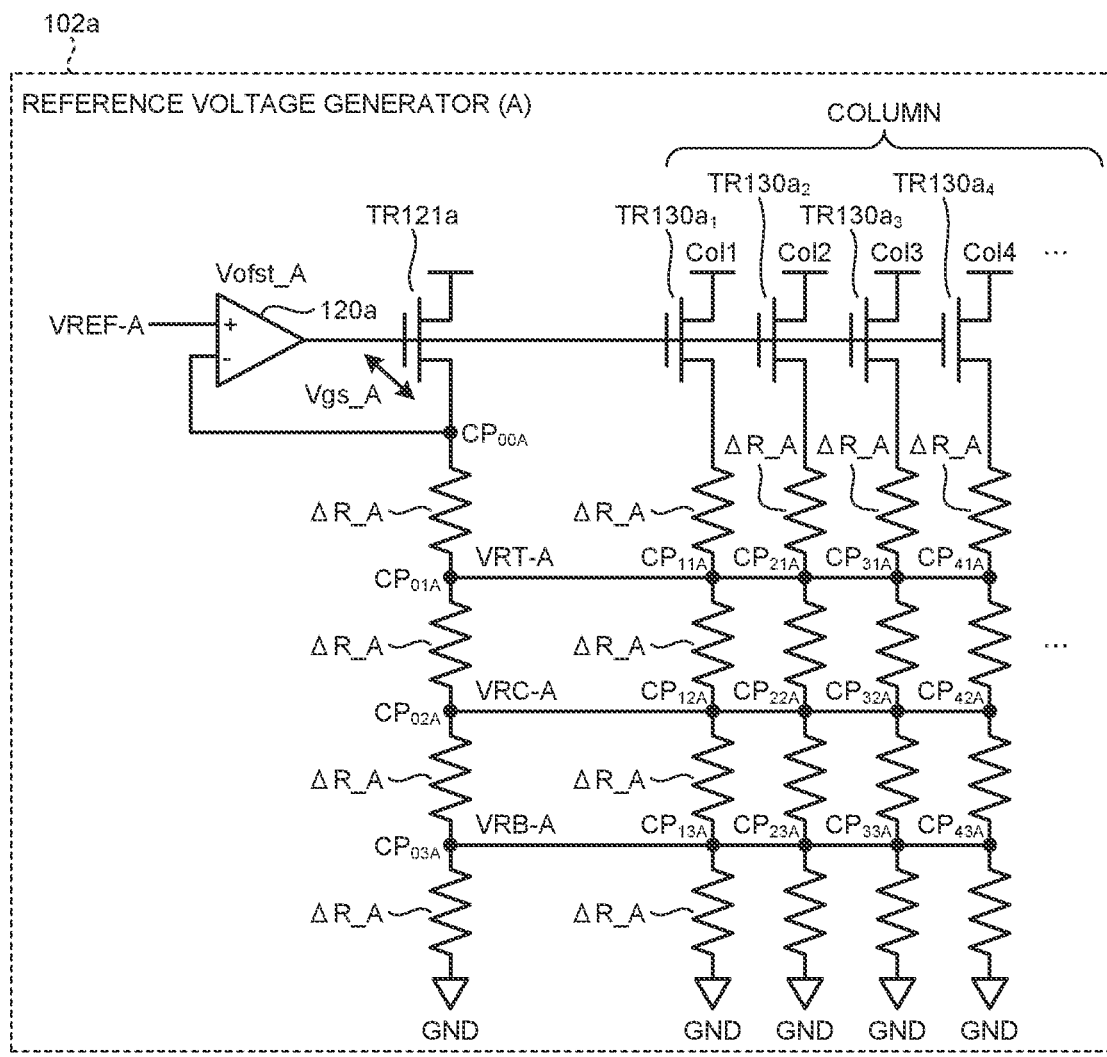
FIG. 12A is a diagram illustrating more specifically a structure of a reference voltage generator applicable to the first embodiment.
Figure 12B:
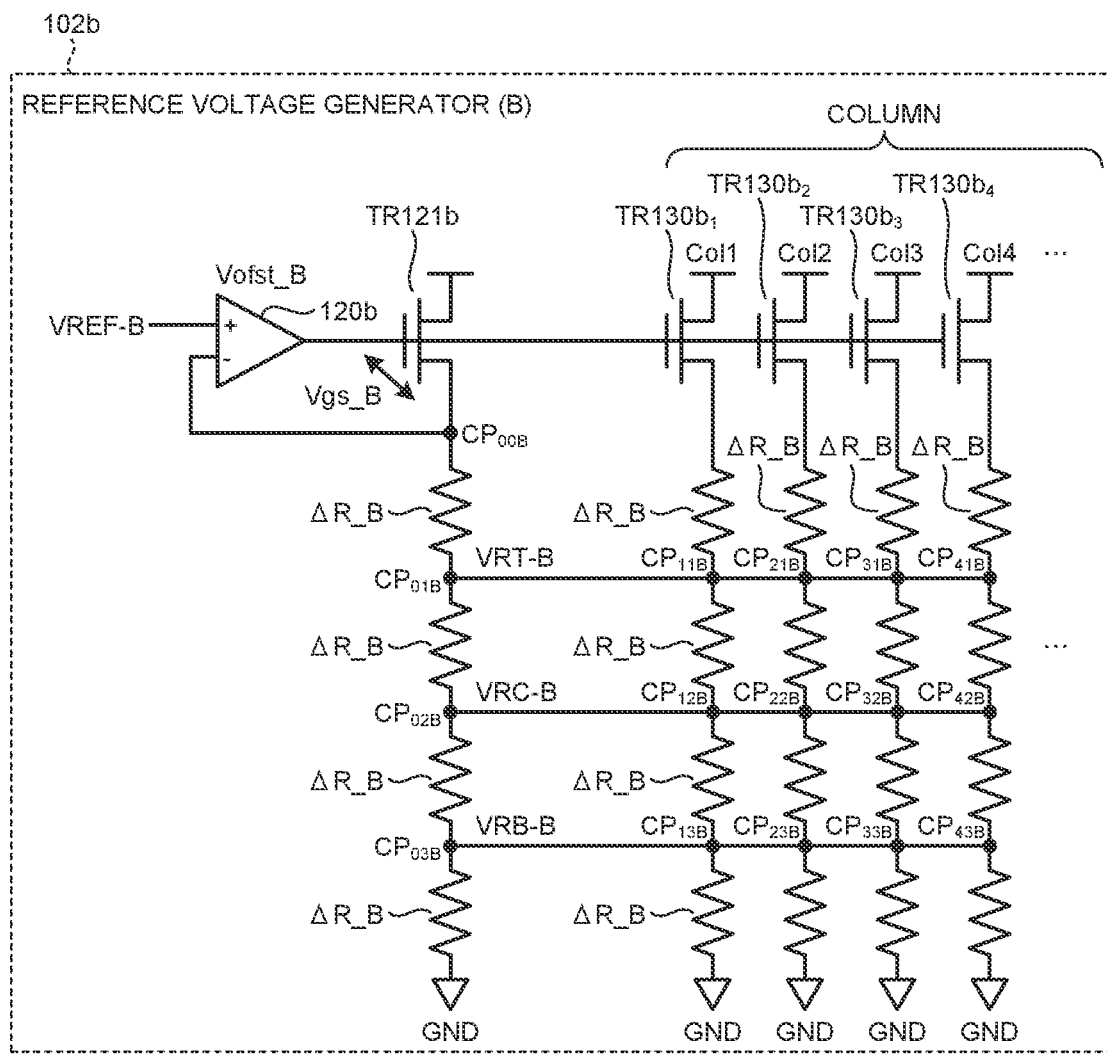
FIG. 12B is a diagram illustrating more specifically a structure of another reference voltage generator applicable to the first embodiment.

When a plurality of systems that generate and supply reference voltages are included, it is necessary to reduce variance among the systems. FIGS. 12A and 12B are diagrams illustrating more specifically the structures of the reference voltage generators 102a and 102b, which are applicable to the first embodiment. In the example illustrated in FIG. 12A, the reference voltage generator 102a is structured using a feedback amplifier 120a, source follower transistors TR121a, TR130$a_1$, TR130$a_2$, TR130$a_3$, TR130$a_4$, . . . , and reference resistors ΔR_A having a resistance value of ΔR_A.

A positive input end of the feedback amplifier 120a receives the voltage VREF-A and an output end of the feedback amplifier 120a is connected to a gate of the source follower transistor TR121a. A source of the transistor TR121a is connected to the ground potential (GND) via a connection point $CP_{00A}$ and the four reference resistors ΔR_A, and connected to a negative input terminal of the feedback amplifier 120a. A voltage Vgs-A is a gate-source voltage of the transistor TR121a. The upper limit voltage VRT-A, the intermediate voltage VRC-A, and the lower limit voltage VRB-A are taken out from connection points $CP_{01A}$, $CP_{02A}$, and $CP_{03A}$, respectively, which connect the four reference resistors ΔR_A.

Hereinafter, a structure composed of the feedback amplifier 120a, the transistor TR121a, and the four reference resistors ΔR_A connected to the source of the transistor TR121a via the connection point $CP_{00A}$ is called a voltage generation unit (A) as appropriate.

The output end of the feedback amplifier 120a is connected to the gates of the source follower transistors TR130$a_1$, TR130$a_2$, . . . , corresponding to the respective AD converters (e.g., the successive approximation type AD converters 10d) in a column direction. The sources of the transistors TR130$a_1$, TR130$a_2$, . . . , are each connected to the ground potential (GND) via the four reference resistors ΔR_A.

The structure illustrated in FIG. 12A allows the structure of the voltage generation unit (A) to be provided outside the successive approximation type AD converters 10d. In this case, the transistors TR130$a_1$, TR130$a_2$, . . . , and the four reference resistors ΔR_A connected to the respective transistors TR130$a_1$, TR130$a_2$, . . . , are each included in the reference voltage generator 102a included in the respective successive approximation type AD converters 10$_1$, 10$_2$, . . . , 10$_{n-1}$, and 10$_n$, illustrated in FIG. 2, each of which corresponds to the column, that is, the successive approximation type AD converter 10d.

In each column, the upper limit voltage VRT-A is taken out from each of the connection points $CP_{11A}$, $CP_{21A}$, $CP_{31A}$, and $CP_{41A}$, the intermediate voltage VRC-A is taken out from each of the connection points $CP_{12A}$, $CP_{22A}$, $CP_{32A}$, and $CP_{42A}$, and the upper limit voltage VRT-A is taken out from each of the connection points $CP_{13A}$, $CP_{23A}$, $CP_{33A}$, and $CP_{43A}$.

In this case, for reducing variance of the upper limit voltage VRT-A, the intermediate voltage VRC-A, and the lower limit voltage VRB-A among the columns, the connection points $CP_{01A}$, $CP_{02A}$, and $CP_{03A}$ are connected to the connection points having the same potential in each column, respectively, out of the connection points $CP_{11A}$ to $CP_{43A}$. In the example illustrated in FIG. 12A, the connection points $CP_{01A}$, $CP_{11A}$, $CP_{21A}$, $CP_{31A}$, and $CP_{41A}$ are connected, the connection points $CP_{02A}$, $CP_{12A}$, $CP_{22A}$, $CP_{32A}$, and $CP_{42A}$ are connected, and the connection points $CP_{03A}$, $CP_{13A}$, $CP_{23A}$, $CP_{33A}$, and $CP_{43A}$ are connected. Furthermore, the connection point $CP_{00A}$ may be connected to the respective sources of the transistors $TR130a_1$, $TR130a_2$, ..., in the respective columns.

The connection points having the same potential are connected one another as described above, thereby reducing the variance of the gate-source voltage Vgs_A among the transistors TR121a, $TR130a_1$, $TR130a_2$, ..., and the variance among the reference resistors ΔR_A.

The reference voltage generator 102b has the same structure as described above. The reference voltage generator 102b includes a feedback amplifier 120b, source follower transistors TR121b, $TR130b_1$, $TR130b_2$, $TR130b_3$, $TR130b_4$, ..., and a reference resistors ΔR_B having a resistance value of ΔR_B. The structure of the reference voltage generator 102b is the same as that of the reference voltage generator 102a described with reference to FIG. 12A. The detailed description thereof is omitted.

Hereinafter, a structure composed of the feedback amplifier 120b, the transistor TR121b, and the four reference resistors ΔR_A connected to the source of the transistor TR121b via a connection point $CP_{00B}$ is called a voltage generation unit (B) as appropriate.

In the reference voltage generator 102b, in the same manner as the reference voltage generator 102a, for reducing variance of the upper limit voltage VRT-B, the intermediate voltage VRC-B, and the lower limit voltage VRB-B among the columns, connection points $CP_{01B}$, $CP_{02B}$, and $CP_{03B}$ are connected to the connection points having the same potential out of the connection points $CP_{11B}$ to $CP_{43B}$ in the columns. In the example illustrated in FIG. 12A, the connection points $CP_{01B}$, $CP_{11B}$, $CP_{21B}$, $CP_{31B}$, and $CP_{41B}$ are connected, the connection points $CP_{02B}$, $CP_{12B}$, $CP_{22B}$, $CP_{32B}$, and $CP_{42B}$ are connected, and the connection points $CP_{03B}$, $CP_{13B}$, $CP_{23B}$, $CP_{33B}$, and $CP_{43B}$ are connected. Furthermore, the connection point $CP_{00B}$ may be connected to the sources of the transistors $TR130b_1$, $TR130b_2$, ..., in the columns.

The connection points having the same potential are connected one another as described above, thereby reducing the variance of the gate-source voltage Vgs_B among the transistors TR121b, $TR130b_1$, $TR130b_2$, ..., and the variance among the reference resistors ΔR_A in the example illustrated in FIG. 12B.

The variance between the respective systems, that is, the reference voltage generators 102a and 102b is not reduced. The two feedback amplifiers 120a and 120b are included. A difference between the offset voltages Vofst_A and Vofst_B, thus, becomes a problem.

FIG. 13 is a diagram illustrating a first example of a structure that can reduce the variance among a plurality of systems and is applicable to the first embodiment. In FIG. 13, the voltage generation unit (A) is illustrated in the reference voltage generator 102a while a part of the voltage generation unit (B) is illustrated in the reference voltage generator 102b. The structures of the respective columns are the same as those in FIGS. 12A and 12B. The descriptions thereof are, thus, omitted to avoid complicated illustration. In FIG. 13, the structure from the connection point $CP_{02B}$ in the voltage generation unit (B) of the reference voltage generator 102b to the ground potential is omitted.

In the structure illustrated in FIG. 13, the connection points having the same potential are connected one another in the voltage generation units (A) and (B). In the example illustrated in FIG. 13, the connection point $CP_{03A}$ of the voltage generation unit (A) and the connection point $CP_{01B}$ of the voltage generation unit (B) have the same potential and are connected each other via a resistor $R_{short}$. This makes it possible to reduce a variance between the gate source voltage Vsg_A of the transistor TR121a and the gate source voltage Vsg_B of the transistor TR121b, a variance between the reference resistors ΔR_A and ΔR_B, and a variance between the offset voltage Vofst_A of the feedback amplifier 120a and the offset voltage Vofst_B of the feedback amplifier 120b, between the systems.

In the first embodiment, the reference voltage generators 102a and 102b can independently change the reference voltages. With a change in reference voltage, the connection destinations are changed as illustrated with the dotted lines in FIG. 13. Such control can be performed by the control unit 1002, for example.

Figure 14:
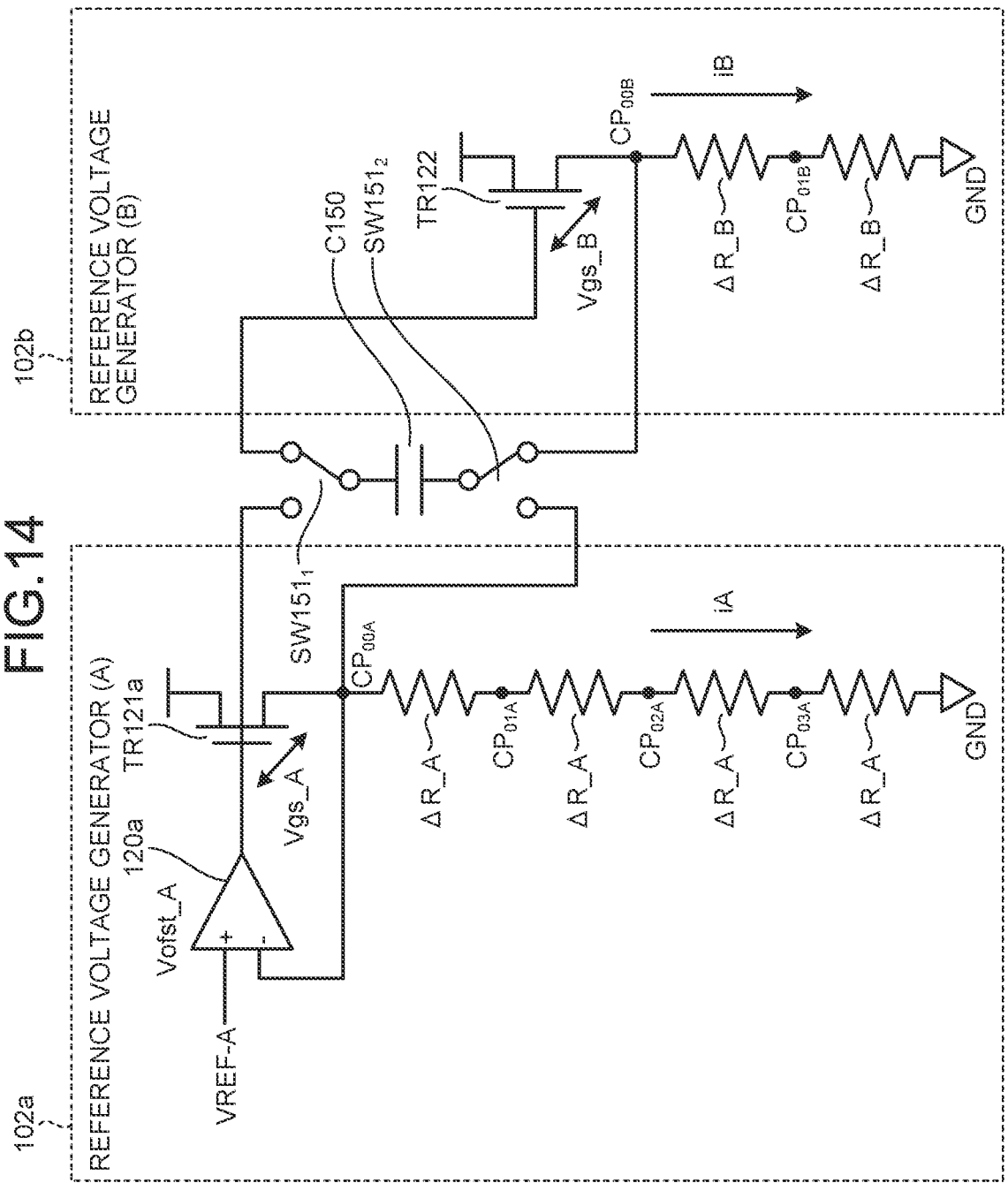
FIG. 14 is a diagram illustrating a second example of the structure that can reduce the variance among the multiple systems and is applicable to the first embodiment.

FIG. 14 is a diagram illustrating a second example of the structure that can reduce the variance among a plurality of systems and is applicable to the first embodiment. In FIG. 14, the voltage generation unit (A) is illustrated in the reference voltage generator 102a while a part of the voltage generation unit (B) is illustrated in the reference voltage generator 102b. The structures of the respective columns are the same as those in FIGS. 12A and 12B. The descriptions thereof are, thus, omitted to avoid complicated illustration. In FIG. 13, the structure from the connection point $CP_{02B}$ in the voltage generation unit (B) of the reference voltage generator 102b to the ground potential is omitted.

In the structure illustrated in FIG. 14, the reference voltage generator 102b does not include the feedback amplifier 120b, and a voltage generation unit (B)', which corresponds to the voltage generation unit (B), is structured by a transistor TR122 and the multiple reference resistors ΔR_B connected to the source of the transistor TR122 via the connection point $CP_{02B}$.

When a source current iA of the transistor TR121a in the voltage generation unit (A) and a source current iB of the transistor TR122 in the voltage generation unit (B)' are equal, the gate-source voltage Vgs_A of the transistor TR121a and the gate-source voltage Vgs_B of the transistor TR122 are equal.

In the structure illustrated in FIG. 14, a sample hold circuit composed of switches SW1511 and SW1512, and a capacitor C150 is provided between the reference voltage generators 102a and 102b, for example. The sample hold circuit acquires the gate-source voltage Vgs_A of the transistor TR121a and supplies the acquired gate-source voltage Vgs_A to the gate and the source of the transistor TR122 in the voltage generation unit (B)' of the reference voltage generator 102b. As a result, the gate-source voltage Vgs_B of the transistor TR122 is equal to the gate-source voltage Vgs_A of the transistor TR121a.

This structure makes it possible to eliminate the feedback amplifier 120b of the reference voltage generator 102b. As a result, the variance between the offset voltage Vofst_A of the feedback amplifier 120*a* and the offset voltage Vofst_B of the feedback amplifier 120*b*, which is described with reference to FIGS. 12A and 12B, can be eliminated.

The first example described with reference to FIG. 13 and the second example described with reference to FIG. 14 can be combined and the resulting combination can also be applied to the successive approximation type AD converter 10*d* according to the first embodiment.

Second Embodiment

The following describes a second embodiment. In the first embodiment described above, the successive approximation type AD converter 10*d* according to the disclosure is applied to the solid state imaging element 1 that outputs image data according to irradiation light. The application is not limited to this example. The second embodiment is an example where the successive approximation type AD converter 10*d* according to the disclosure is applied to an indirect ToF method range image sensor that measures a distance by an indirect ToF method.

The indirect ToF method is a technique in which light source light (e.g., laser light in an infrared region) modulated by pulse width modulation (PWM), for example, is emitted to a measurement target, reflected light from the measurement target is received by a light receiving element, and a distance to the measurement target is measured on the basis of a phase difference between the received reflected light and the light source light. In the indirect ToF method, a distance is measured on the basis of a ratio of a time in which reflected light of light source light is received in an off period in the PWM of light source light to a sum of a time in which reflected light of light source light is received in an on period in the PWM of light source light and the time in which the reflected light of the light source light is received in the off period just after the on period, for example.

Figure 15:
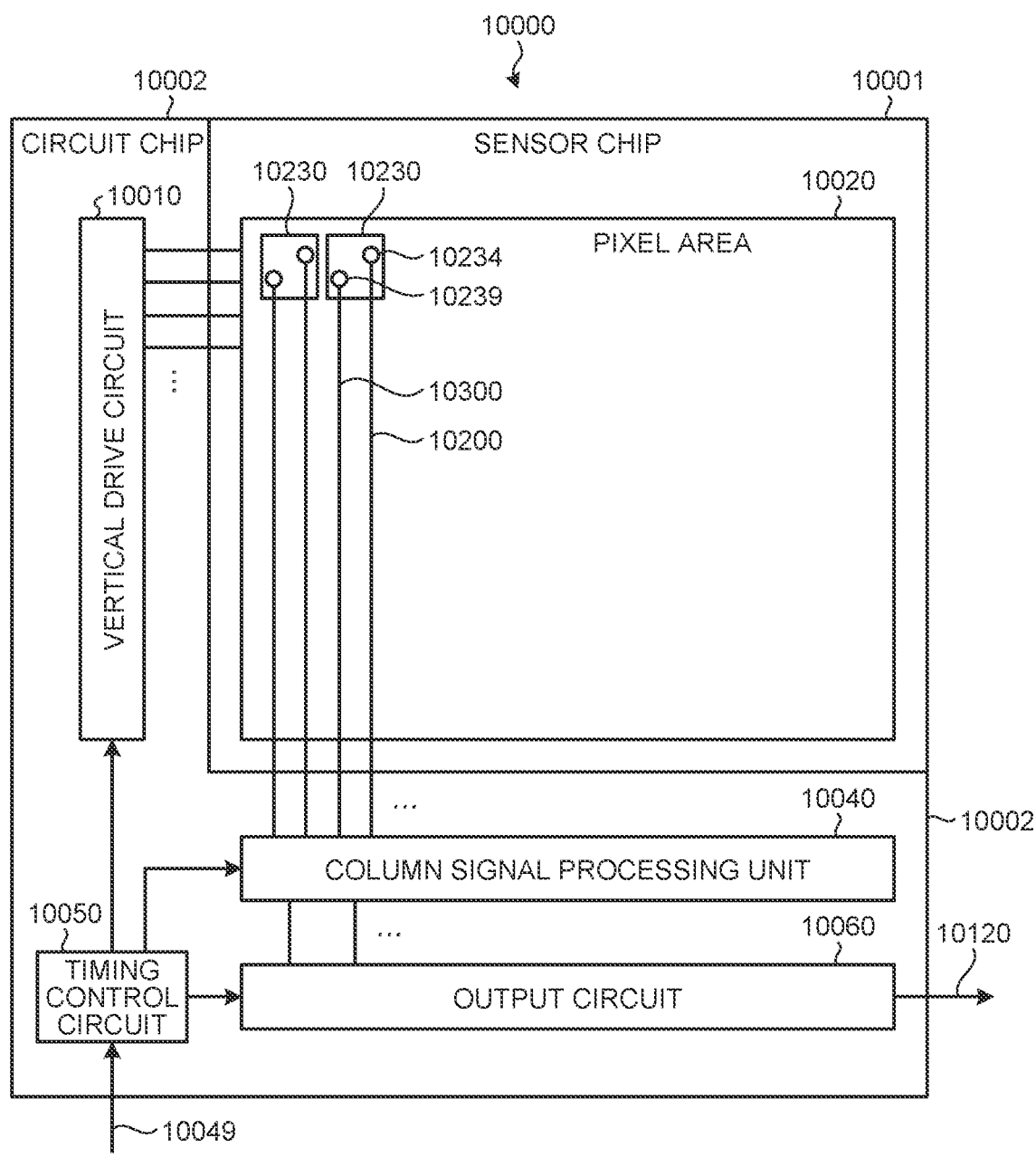
FIG. 15 is a diagram roughly illustrating an exemplary structure of an indirect ToF method range image sensor applicable to a second embodiment.

FIG. 15 is a diagram roughly illustrating an exemplary structure of an indirect ToF method range image sensor applicable to the second embodiment. In FIG. 15, an indirect ToF method range image sensor 10000 has a layered structure including a sensor chip 10001 and a circuit chip 10002 layered on the sensor chip 10001. In the layered structure, the sensor chip 10001 and the circuit chip 10002 are electrically connected via connection portions (not illustrated) such as via (VIA) connections and Cu-Cu connections. In the example illustrated in FIG. 15, a state is illustrated in which wiring lines of the sensor chip 10001 and the wiring lines of the circuit chip 10002 are connected by the connection portions.

A pixel area 10020 includes a plurality of pixels 10230 arranged in an array shape on the sensor chip 10001 with a two-dimensional grid pattern. Each of the pixels 10230 arranged in the pixel area 10020 can receive infrared light, for example, and performs photoelectric conversion on the basis of the received infrared light to output an analog pixel signal. To each of the pixels 10230 included in the pixel area 10020, two vertical signal lines 10200 and 10300 are connected.

In the indirect ToF method range image sensor 10000, a vertical drive circuit 10010, a column signal processing unit 10040, a timing control circuit 10050, and an output circuit 10060 are arranged in the circuit chip 10002.

The timing control circuit 10050 controls the driving timing of the vertical drive circuit 10010 in accordance with an external control signal 10049. The timing control circuit 10050 generates a vertical synchronization signal on the basis of the control signal 10049. The column signal processing unit 10040 and the output circuit 10060 perform respective pieces of processing in synchronization with the vertical synchronization signal generated by the timing control circuit 10050.

The vertical signal lines 10200 and 10300 are wired for each column of the pixels 10230 in the vertical direction in FIG. 15. When the total number of columns in the pixel area 10020 is M columns (M is an integer equal to or larger than one), 2×M number of vertical signal lines are wired in total in the pixel area 10020. Each pixel 10230 includes two taps TAP_A and TAP_B that store therein charges generated by photoelectric conversion, which are described later in detail. The vertical signal line 10200 is connected to the tap TAP_B of the pixel 10230 while the vertical signal line 10300 is connected to the tap TAP_A of the pixel 10230.

To the vertical signal line 10200, a pixel signal $AIN_{P1}$, which is an analog pixel signal based on the charges in the tap TAP_B of the pixel 10230 in the corresponding pixel column, is output. To the vertical signal line 10300, a pixel signal $AIN_{P2}$, which is an analog pixel signal based on the charges in the tap TAP_A of the pixel 10230 in the corresponding pixel column, is output.

The vertical drive circuit 10010 drives the pixels 10230 included in the pixel area 10020 on a pixel row basis in accordance with the timing control by the timing control circuit 10050 to cause each pixel 10230 to output the pixel signals $AIN_{P1}$ and $AIN_{P2}$. The pixel signals $AIN_{P1}$ and $AIN_{P2}$ output from each pixel 10230 are supplied to the column signal processing unit 10040 via the vertical signal line 10300 and 10200 in each column.

The column signal processing unit 10040 includes a plurality of AD converters provided for each pixel column corresponding to the pixel column in the pixel area 10020, for example. Each AD converter included in the column signal processing unit 10040 performs AD conversion on the pixel signal $AIN_{P1}$ and $AIN_{P2}$ supplied via the vertical signal lines 10300 and 10200, and supplies the pixel signal $AIN_{P1}$ and $AIN_{P2}$ having been converted into digital signals to the output circuit 10060.

The output circuit 10060 performs signal processing such as correlated double sampling (CDS) processing on the pixel signal $AIN_{P1}$ and $AIN_{P2}$ that have been output from the column signal processing unit 10040 and converted into the digital signals, and outputs the pixel signal $AIN_{P1}$ and $AIN_{P2}$ after the signal processing to a signal processing circuit on a rear stage via an output line 10120.

Figure 16:
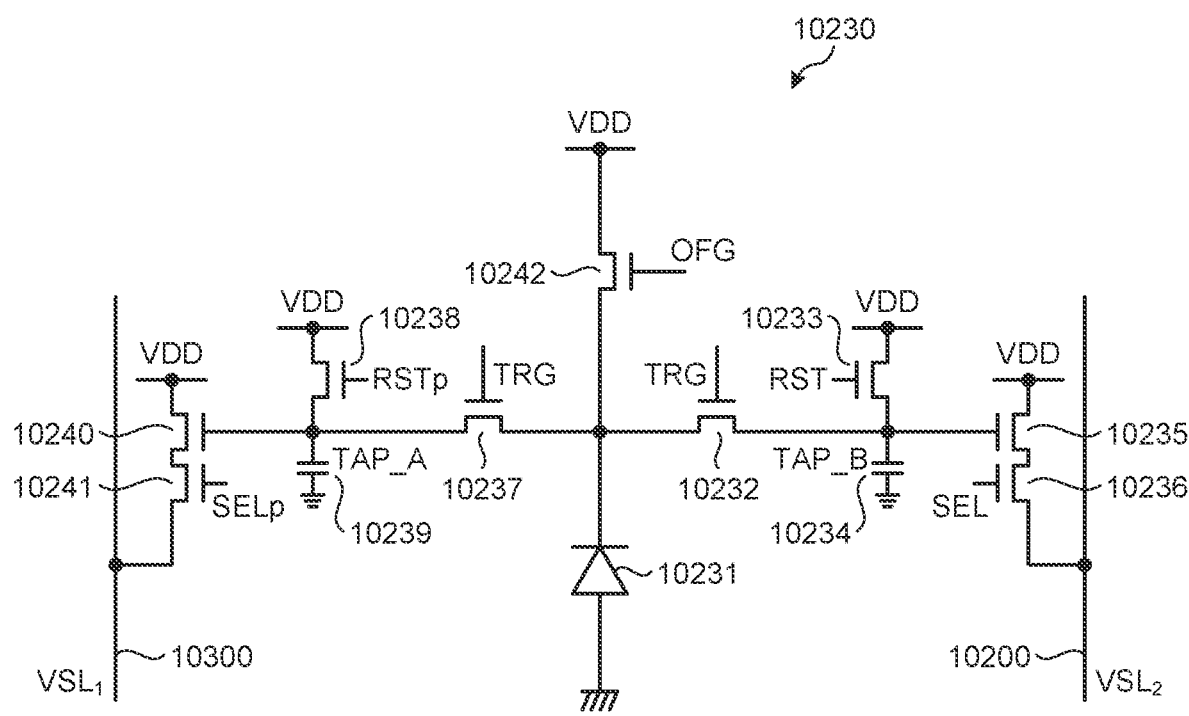
FIG. 16 is a circuit diagram illustrating an exemplary structure of a pixel applicable to the second embodiment.

FIG. 16 is a circuit diagram illustrating an exemplary structure of the pixel 10230 applicable to the second embodiment. The pixel 10230 includes a photo diode 10231, two transfer transistors 10232 and 10237, two reset transistors 10233 and 10238, two floating diffusion layers 10234 and 10239, two amplifier transistors 10235 and 10240, and two select transistors 10236 and 10241. The floating diffusion layers 10234 and 10239 correspond to the taps TAP_B and TAP_A, respectively.

The photo diode 10231 is a light receiving element that performs photoelectric conversion on received light to generate charges. The photo diode 10231 is disposed on a rear surface opposite a surface that is a face on which circuits are arranged of a semiconductor substrate. Such a solid state imaging element is called a rear surface irradiation type solid state imaging element. Instead of the rear surface irradiation type, a surface irradiation type structure can be used in which the photo diode 10231 is disposed on the surface.

An overflow transistor 10242, which is connected between a cathode of the photo diode 10231 and a power supply line VDD, has a function to reset the photo diode 10231. The overflow transistor 10242 turns on in response to an overflow gate signal OFG supplied from the vertical drive circuit 10010 to sequentially output charges in the photo diode 10231 to the power supply line VDD.

The transfer transistor 10232 is connected between the cathode of the photo diode 10231 and the floating diffusion layer 10234. The transfer transistor 10237 is connected between the cathode of the photo diode 10231 and the floating diffusion layer 10239. The transfer transistors 10232 and 10237 sequentially transfer charges generated by the photo diode 10231 to the floating diffusion layers 10234 and 10239, respectively, in response to transfer signals TRG supplied from the vertical drive circuit 10010.

The floating diffusion layers 10234 and 10239, which correspond to the tap TAP_B and TAP_A, respectively, store therein charges transferred from the photo diode 10231, covert the charges into the analog signals having voltage values according to the amount of the stored charges, and generate the pixel signals $AIN_{P2}$ and $AIN_{P1}$, respectively.

The two reset transistors 10233 and 10238 are connected between the power supply line VDD and the floating diffusion layers 10234 and 10239, respectively. The reset transistors 10233 and 10238 turn on in response to reset signals RST and $RST_P$ that are supplied from the vertical drive circuit 10010 to pull out charges from the floating diffusion layers 10234 and 10239, respectively, thereby initializing the floating diffusion layers 10234 and 10239.

The two amplifier transistors 10235 and 10240 are connected between the power supply line VDD and the select transistors 10236 and 10241, respectively. Each of the amplifier transistors 10235 and 10240 amplifies the voltage signal having a voltage converted from charges by the floating diffusion layers 10234 and 10239, respectively.

The select transistor 10236 is connected between the amplifier transistor 10235 and the vertical signal line 10200 ($VSL_2$). The select transistor 10241 is connected between the amplifier transistor 10240 and the vertical signal line 10300 ($VSL_1$). The select transistors 10236 and 10241 turn on in response to selection signals SEL and $SEL_P$ that are supplied from the vertical drive circuit 10010 to output the pixel signals $AIN_{P2}$ and $AIN_{P1}$ that have been amplified by the amplifier transistors 10235 and 10240, respectively, to the vertical signal line 10200 ($VSL_2$) and the vertical signal line 10300 ($VSL_1$), respectively.

The vertical signal line 10200 ($VSL_2$) and the vertical signal line 10300 ($VSL_1$) connected to the pixel 10230 are connected, for each pixel column, to the input end of a single AD converter included in the column signal processing unit 10030. The vertical signal line 10200 ($VSL_2$) and the vertical signal line 10300 ($VSL_1$) supply, for each pixel column, the pixel signals $AIN_{P2}$ and $AIN_{P1}$ that are output from the pixel 10230 to the AD converter included in the column signal processing unit 10040.

The circuit structure of the pixel 10230 is not limited to that illustrated in FIG. 16. Any circuit structure is acceptable that can generate the pixel signals $AIN_{P1}$ and $AIN_{P2}$ by photoelectric conversion.

As an example of application to the indirect ToF method, a period of the PWM signal driving a light source (not illustrated), and the overflow gate signal OFG, the transfer signal TRG, the reset signals RST and $RST_P$, and the select signals SEL and $SEL_P$ are synchronized to switch output of the pixel signals $AIN_{P1}$ and $AIN_{P2}$ in the on period and the off period of the PWM signal. As a result, the structures illustrated in FIGS. 15 and 16 can achieve the operation of the indirect ToF method range image sensor.

In the structure of the indirect ToF method range image sensor 10000 illustrated in FIGS. 15 and 16, the technique according to the disclosure is applicable to the respective AD converters included in the column signal processing unit 10040. The successive approximation type AD converter 10d described in the first embodiment can be applied to the respective AD converters included in the column signal processing unit 10040 illustrated in FIG. 15.

The effects described in the specification are only represented by way of example, and are not limited to those. Other effects may be included.

The technique can also include the following structures.
Claims
(1) A solid state imaging element, comprising:
  a converter that converts an analog pixel signal read out from a pixel into a bit value, successively for each of a plurality of bits, on the basis of a threshold voltage set according to a conversion history of the bit converted before a target bit;
  a plurality of voltage generation units that each generate a plurality of reference voltages; and
  a setting unit that sets the threshold voltage using the reference voltage selected from the reference voltages generated by each of the voltage generation units on the basis of the conversion history.
(2) The solid state imaging element according to the above (1), wherein the voltage generation units include:
  a first voltage generation unit that generates the reference voltages for conversion by the converter from the analog pixel signal into the bit value of the bit on a high order side; and
  a second voltage generation unit that generates the reference voltages for conversion by the converter from the analog pixel signal into the bit value of the bit on a low order side.
(3) The solid state imaging element according to the above (2), wherein
  the second voltage generation unit generates a plurality of reference voltages having a voltage range overlapping with the reference voltages generated by the first voltage generation unit, and
  the setting unit sets the threshold voltage by changing the reference voltage selected on the basis of the conversion history on the basis of the reference voltage included in the voltage range.
(4) The solid state imaging element according to the above (3), wherein the second voltage generation unit generates the reference voltages such that two or more reference voltages are included in the voltage range when a gain with respect to the analog pixel signal is equal to or larger than a certain value.
(5) The solid state imaging element according to the above (3), wherein the second voltage generation unit generates the reference voltages such that a single reference voltage is included in the voltage range when a gain with respect to the analog pixel signal is smaller than a certain value.
(6) The solid state imaging element according to any one of the above (1) to (5), wherein, out of connection points from which the reference voltages generated by each of the voltage generation units are taken out, respectively, the connection points having identical potential are connected one another.
(7) The solid state imaging element according to any one of the above (1) to (6), further comprising a sample hold unit that samples the voltage generated by one of the voltage generation units and supplies the sampled voltage to another of the voltage generation units.

(8) An electronic apparatus, comprising:
a solid state imaging element that includes
a converter that converts an analog pixel signal read out from a pixel into a bit value, successively for each of a plurality of bits, on the basis of a threshold voltage set according to a conversion history of the bit converted before a target bit,
a plurality of voltage generation units that each generates a plurality of reference voltages, and
a setting unit that sets the threshold voltage using the reference voltage selected from the reference voltages generated by each of the respective voltage generation units on the basis of the conversion history; and
an image processing unit that performs image processing on a digital pixel signal converted by the converter from the analog pixel signal into a bit value for each bit.

(9) The electronic apparatus according to the above (8), wherein the voltage conversion units include:
a first voltage generation unit that generates the reference voltages for conversion by the converter from the analog pixel signal into the bit value of the bit on a high order side; and
a second voltage generation unit that generates the reference voltages for conversion by the converter from the analog pixel signal into the bit value of the bit on a low order side.

(10) The electronic apparatus according to the above (9), wherein
the second voltage generation unit generates a plurality of reference voltages having a voltage range overlapping with the reference voltages generated by the first voltage generation unit, and
the setting unit sets the threshold voltage by changing the reference voltage selected on the basis of the conversion history on the basis of the reference voltage included in the voltage range.

(11) The electronic apparatus according to the above (10), wherein the second voltage generation unit generates the reference voltages such that two or more reference voltages are included in the voltage range when a gain with respect to the analog pixel signal is equal to or larger than a certain value.

(12) The electronic apparatus according to the above (10), wherein the second voltage generation unit generates the reference voltages such that a single reference voltage is included in the voltage range when a gain with respect to the analog pixel signal is smaller than a certain value.

(13) The electronic apparatus according to any one of the above (8) to (12), wherein, in the solid state imaging element, out of connection points from which the reference voltages generated by each of the voltage generation units are taken out, respectively, the connection points having identical potential are connected one another.

(14) The electronic apparatus according to any one of the above (8) to (13), wherein the solid state imaging element further includes a sample hold unit that samples the voltage generated by one of the voltage generation units and supplies the sampled voltage to another of the voltage generation units.

(15) The electronic apparatus according to any one of the above (8) to (14), wherein the electronic apparatus is an indirect ToF method range image sensor.

REFERENCE SIGNS LIST 1 solid state imaging element
2 pixel array unit
5 AD conversion unit
$10_1$, $10_2$, $10_n$, $10a$, $10b$, $10c$, $10d$ successive approximation type AD converter
12, 12a, 12b, 12c, 12d DA converter
14, 200 comparator
15 logic unit
102a, 102b reference voltage generator
$C110_1$, $C110_2$, $C110_3$, $C110_4$, C116, C150, $C213_1$, $C213_2$, $C214_1$, $C214_2$ capacitor
$SW111_1$, $SW111_2$, $SW111_3$, $SW111_4$, SW117, $SW151_1$, $SW151_2$, $SW211_1$, $SW211_2$, $SW211_3$, $SW211_4$, $SW216_1$, $SW216_2$, $SW216_3$, $SW216_4$, $SW216_5$ switch

The invention claimed is:

1. A solid state imaging element, comprising:
a converter that converts an analog pixel signal read out from a pixel into a bit value, successively for each of a plurality of bits, on the basis of a threshold voltage set according to a conversion history of the bit converted before a target bit;
a plurality of voltage generation units that each generate a plurality of reference voltages; and
a setting unit that sets the threshold voltage using the reference voltage selected from the reference voltages generated by each of the voltage generation units on the basis of the conversion history.

2. The solid state imaging element according to claim 1, wherein the voltage generation units include:
a first voltage generation unit that generates the reference voltages for conversion by the converter from the analog pixel signal into the bit value of the bit on a high order side; and
a second voltage generation unit that generates the reference voltages for conversion by the converter from the analog pixel signal into the bit value of the bit on a low order side.

3. The solid state imaging element according to claim 2, wherein
the second voltage generation unit generates a plurality of reference voltages having a voltage range overlapping with the reference voltages generated by the first voltage generation unit, and
the setting unit sets the threshold voltage by changing the reference voltage selected on the basis of the conversion history on the basis of the reference voltage included in the voltage range.

4. The solid state imaging element according to claim 3, wherein the second voltage generation unit generates the reference voltages such that two or more reference voltages are included in the voltage range when a gain with respect to the analog pixel signal is equal to or larger than a certain value.

5. The solid state imaging element according to claim 3, wherein the second voltage generation unit generates the reference voltages such that a single reference voltage is included in the voltage range when a gain with respect to the analog pixel signal is smaller than a certain value.

6. The solid state imaging element according to claim 1, wherein, out of connection points from which the reference voltages generated by each of the voltage generation units are taken out, respectively, the connection points having identical potential are connected one another.

7. The solid state imaging element according to claim 1, further comprising a sample hold unit that samples the voltage generated by one of the voltage generation units and supplies the sampled voltage to another of the voltage generation units.

8. An electronic apparatus, comprising:
a solid state imaging element that includes
- a converter that converts an analog pixel signal read out from a pixel into a bit value, successively for each of a plurality of bits, on the basis of a threshold voltage set according to a conversion history of the bit converted before a target bit,
- a plurality of voltage generation units that each generates a plurality of reference voltages, and
- a setting unit that sets the threshold voltage using the reference voltage selected from the reference voltages generated by each of the respective voltage generation units on the basis of the conversion history; and
- an image processing unit that performs image processing on a digital pixel signal converted by the converter from the analog pixel signal into a bit value for each bit.

9. The electronic apparatus according to claim 8, wherein the voltage conversion units include:
- a first voltage generation unit that generates the reference voltages for conversion by the converter from the analog pixel signal into the bit value of the bit on a high order side; and
- a second voltage generation unit that generates the reference voltages for conversion by the converter from the analog pixel signal into the bit value of the bit on a low order side.

10. The electronic apparatus according to claim 9, wherein
the second voltage generation unit generates a plurality of reference voltages having a voltage range overlapping with the reference voltages generated by the first voltage generation unit, and
the setting unit sets the threshold voltage by changing the reference voltage selected on the basis of the conversion history on the basis of the reference voltage included in the voltage range.

11. The electronic apparatus according to claim 10, wherein the second voltage generation unit generates the reference voltages such that two or more reference voltages are included in the voltage range when a gain with respect to the analog pixel signal is equal to or larger than a certain value.

12. The electronic apparatus according to claim 10, wherein the second voltage generation unit generates the reference voltages such that a single reference voltage is included in the voltage range when a gain with respect to the analog pixel signal is smaller than a certain value.

13. The electronic apparatus according to claim 8, wherein, in the solid state imaging element, out of connection points from which the reference voltages generated by each of the voltage generation units are taken out, respectively, the connection points having identical potential are connected one another.

14. The electronic apparatus according to claim 8, wherein the solid state imaging element further includes a sample hold unit that samples the voltage generated by one of the voltage generation units and supplies the sampled voltage to another of the voltage generation units.

15. The electronic apparatus according to claim 8, wherein the electronic apparatus is an indirect ToF method range image sensor.

* * * * *